(12) United States Patent
Sriraman et al.

(10) Patent No.: US 10,163,610 B2
(45) Date of Patent: Dec. 25, 2018

(54) EXTREME EDGE SHEATH AND WAFER PROFILE TUNING THROUGH EDGE-LOCALIZED ION TRAJECTORY CONTROL AND PLASMA OPERATION

(71) Applicant: Lam Research Corporation, Fremont, CA (US)

(72) Inventors: Saravanapriyan Sriraman, Fremont, CA (US); Tom A. Kamp, Fremont, CA (US); Alexander Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 456 days.

(21) Appl. No.: 15/067,068

(22) Filed: Mar. 10, 2016

(65) Prior Publication Data

US 2017/0018411 A1    Jan. 19, 2017

Related U.S. Application Data

(60) Provisional application No. 62/191,817, filed on Jul. 13, 2015.

(51) Int. Cl.
*H01J 37/32*    (2006.01)
*H01L 21/67*    (2006.01)
*H01L 21/683*   (2006.01)

(52) U.S. Cl.
CPC ..... *H01J 37/32697* (2013.01); *H01J 37/3211* (2013.01); *H01J 37/32495* (2013.01);
(Continued)

(58) Field of Classification Search
CPC ............. H01J 37/32697; H01J 37/3211; H01J 37/32495; H01J 37/32541;
(Continued)

(56) References Cited

U.S. PATENT DOCUMENTS 9,184,043 B2    11/2015  Sexton et al.
2009/0071938 A1   3/2009  Dhindsa et al.
(Continued)

FOREIGN PATENT DOCUMENTS

CN    101627462 A    1/2010
CN    101720501 A    6/2010
(Continued)

OTHER PUBLICATIONS

Office Action issued in corresponding Chinese Application No. 201610210239.0, dated Jul. 28, 2017 (10 total pages).

*Primary Examiner* — Zeev V Kitov
(74) *Attorney, Agent, or Firm* — Martine Penilla Group, LLP

(57) ABSTRACT

An edge ring assembly for a plasma processing chamber is provided, including: an edge ring configured to surround an electrostatic chuck (ESC) that is configured for electrical connection to a first RF power supply, the ESC having a top surface for supporting a substrate and an annular step surrounding the top surface, the annular step defining an annular shelf that is lower than the top surface; an annular electrode disposed below the edge ring in the annular step and above the annular shelf; a dielectric ring disposed below the annular electrode for isolating the annular electrode from the ESC, the dielectric ring positioned in the annular step over the annular shelf; and, a plurality of insulated connectors disposed through the ESC and through the dielectric ring, each of the plurality of insulated connectors providing electrical connection between a second RF power supply and the annular electrode.

21 Claims, 20 Drawing Sheets

(52) U.S. Cl.
CPC .. *H01J 37/32541* (2013.01); *H01J 37/32568* (2013.01); *H01J 37/32577* (2013.01); *H01J 37/32642* (2013.01); *H01J 37/32715* (2013.01)

(58) Field of Classification Search
CPC ........... H01J 37/32568; H01J 37/32577; H01J 37/32642; H01J 37/32715; H01L 21/6833; H01L 21/67069
See application file for complete search history.

(56) References Cited

U.S. PATENT DOCUMENTS

| | | | | |
|---|---|---|---|---|
| 2009/0166326 | A1* | 7/2009 | Sexton | H01J 37/32009 216/67 |
| 2009/0314433 | A1* | 12/2009 | Hoffman | H01L 21/6833 156/345.48 |
| 2010/0213173 | A1* | 8/2010 | Bailey, III | C23G 1/103 216/87 |
| 2012/0164834 | A1 | 6/2012 | Jennings et al. | |

FOREIGN PATENT DOCUMENTS

| | | |
|---|---|---|
| CN | 103069550 A | 4/2013 |
| EP | 1 686 611 A1 | 2/2006 |

\* cited by examiner

2MHz Powered Edge Ring Reduces Ion Focusing at Extreme Wafer Edge and Provides Way to Control Ion Trajectories
10mT/900W TCP / 200Ar / 200V$_{b,main}$ (10MHz) / ERE (2MHz) × V$_b$
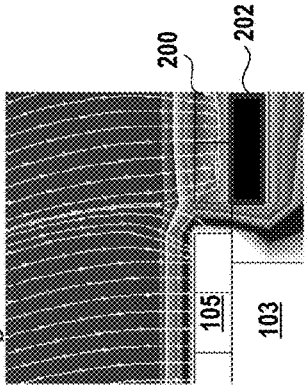
X V$_b$ = 0Vb
FIG. 4A
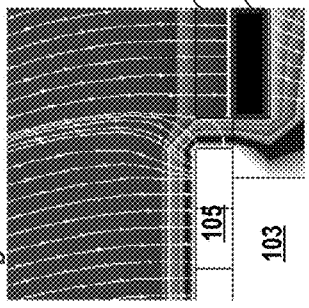
X V$_b$ = 100Vb
FIG. 4B
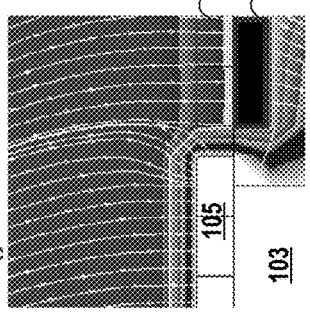
X V$_b$ = 300Vb
FIG. 4C
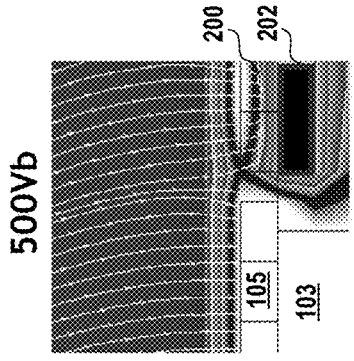
500Vb
FIG. 4D
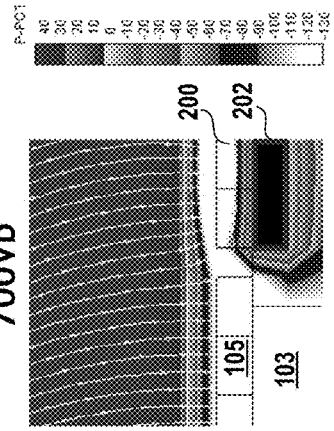
700Vb
FIG. 4E
Buried Electrode
2MHz RF

# EXTREME EDGE SHEATH AND WAFER PROFILE TUNING THROUGH EDGE-LOCALIZED ION TRAJECTORY CONTROL AND PLASMA OPERATION

BACKGROUND

1. Field of the Disclosure

The present embodiments relate to semiconductor wafer processing equipment tools, and more particularly, edge ring assemblies used in plasma process chambers.

2. Description of the Related Art

Despite advances in the pursuit of across-wafer uniformity, etch behavior at the edge and extreme edge regions of the wafer continues to be a challenge. At least 10% of the die are impacted in this region of the wafer and the economic impact can be especially significant considering the increasing cost-per-die. Far edge effects (e.g. at 140-150 mm along a radius of a 300 mm wafer) with an edge exclusion of about 1-5 mm is an active focus of current manufacturing efforts for achieving within wafer uniformity.

Since most processes tend to be transport driven, etch performance depends on plasma composition above a specific area of the wafer, and in any plasma source there will inherently be some non-uniformity and effects from the chamber walls. Plasma species composition of neutrals and ions at the edge of the wafer tends to be different as compared to the center of wafer due to discontinuities resulting from the 'finite wafer size' that causes both electrical and chemical discontinuities. Coupled with gradients in neutral flux, the etch behavior at the extreme wafer edge can be quite different than the rest of the wafer.

Voltage gradients are created at the wafer edge due to the change from a biased surface to a grounded or floating surface. Along with different electrical properties between the wafer and the chamber materials (specifically edge ring), the result is sheath bending and off-normal ion flux and ion focusing to the wafer. This causes undesirable effects on etch features that manifest as non-uniformity either through feature tilting and/or critical dimension (CD) variation.

Currently dielectric edge rings with varying degree of conductivity in reactive ion etch chambers (e.g. Kiyo® series process chambers manufactured by Lam Research Corporation) are used to prevent exposing the electrostatic chuck (ESC) to the processing plasma and inherently give rise to electrical discontinuity near the wafer edge due to change in material properties. An additional tuning knob does not exist for mitigating ion-focusing and ion trajectories caused by bending of the plasma sheath due to this discontinuity in electrical properties and thus the issues of feature tilting as well as CD non-uniformities persist.

It is in this context that embodiments of the disclosures arise.

SUMMARY

Embodiments of the present disclosure provide methods, apparatus, and systems to enable and gain control over the plasma sheath boundary at the extreme wafer edge to facilitate edge-localized ion trajectory control and thereby provide for tuning of the wafer profile at the extreme wafer edge typically ranging from approximately 120-150 mm (along a radius for a 300 mm wafer) and beyond (with edge exclusion ranging from about 0-5 mm) Achieving control over ion trajectory and minimizing the resulting ion focusing effects caused due to sheath bending near the wafer edge can not only manipulate the ion trajectories to the wafer but also the ion to neutral flux ratio (i.e. ion to etchant and/or ion to passivant). Consequently, with additional tuning parameters such as temperature (e.g. of the edge ring and electrostatic chuck (ESC) (e.g. Hydra Uniformity System manufactured by Lam Research Corporation)) and passivant gradient profile (e.g. RTC) critical dimension uniformity (CDU) can also be optimized for reduced technology nodes.

In some implementations, extreme wafer edge control of ion flux and trajectories is achieved through an RF powered edge ring where an electrode is buried inside the edge ring surrounding the wafer and powered at a low RF frequency (voltages are high at low frequencies). By using sufficiently high control voltage on the buried electrode, the plasma sheath boundary in the vicinity of the extreme wafer edge can be modified by enabling a sheath continuity over the edge ring. The presence of the modified sheath boundary due to the low-frequency RF powered edge ring reduces ion tilting and ion focusing at the wafer edge.

In one implementation, an edge ring assembly for a plasma processing chamber is provided, including: an edge ring configured to surround an electrostatic chuck (ESC) that is configured for electrical connection to a first RF power supply, the ESC having a top surface for supporting a substrate and an annular step surrounding the top surface, the annular step defining an annular shelf that is lower than the top surface; an annular electrode disposed below the edge ring and above the annular shelf; a dielectric ring disposed below the annular electrode for isolating the annular electrode from the ESC, the dielectric ring positioned over the annular shelf; and a plurality of insulated connectors disposed through the ESC and through the dielectric ring, each of the plurality of insulated connectors providing electrical connection between a second RF power supply and the annular electrode.

In one implementation, each of the plurality of insulated connectors is defined by a coaxial connector.

In one implementation, the plurality of insulated connectors are configured to isolate the second RF power supply from the first RF power supply.

In one implementation, the edge ring has a top surface, the top surface of the edge ring having a stepped edge defined at an inner diameter of the edge ring, a lower portion of the stepped edge is configured to sit at a lower height than the top surface of the ESC, such that the substrate when present extends over the lower portion of the stepped edge.

In one implementation, at least a portion of the annular electrode is disposed below the stepped edge of the edge ring.

In one implementation, application of RF power to the annular electrode during plasma processing causes a plasma sheath that is defined during the plasma processing to be radially extended in a spatial region that is defined substantially over the edge ring.

In one implementation, the application of RF power to the annular electrode during plasma processing reduces ion focusing at an edge region of the substrate.

In one implementation, the application of RF power to the annular electrode during plasma processing reduces tilting of ion trajectories at the edge region of the substrate away from normal to a top surface of the substrate.

In one implementation, the annular electrode has a radial width of about 5 to 28 millimeters.

In one implementation, the annular electrode has a thickness of about 0.5 mm to 5 millimeters.

In one implementation, the annular electrode is defined by a plurality of concentric electrodes, each of the plurality of concentric electrodes being electrically connected to the second RF power supply.

In one implementation, the annular electrode is defined by a mesh-like structure of a conductive material.

In one implementation, the annular electrode is integrated with the edge ring.

In one implementation, the annular electrode has a radial width that is at least as wide as a radial width of the edge ring.

In another implementation, a system for plasma processing is provided, including: a process chamber; an electrostatic chuck (ESC) disposed in the process chamber, the ESC having a top surface that is configured to support a substrate during plasma processing, the ESC further including an annular step surrounding the top surface, the annular step defining an annular shelf at a lower height than the top surface, the annular shelf configured to accommodate an edge ring assembly, the edge ring assembly including an edge ring configured to surround the ESC, an annular electrode disposed below the edge ring, and a dielectric ring disposed below the annular electrode and over the annular shelf; a bias electrode disposed within the ESC, the bias electrode configured to receive RF power from a first RF power supply to generate a bias voltage on the substrate; a plurality of insulated connectors disposed through the ESC, the plurality of insulated connectors configured to be disposed through the dielectric ring, each of the plurality of insulated connectors configured to provide electrical connection between a second RF power supply and the annular electrode.

In one implementation, each of the plurality of insulated connectors is defined by a coaxial connector.

In one implementation, the plurality of insulated connectors are configured to isolate the second RF power supply from the first RF power supply.

In another implementation, a system for plasma processing is provided, including: a process chamber; an electrostatic chuck (ESC) disposed in the process chamber, the ESC having a top surface that is configured to support a substrate during plasma processing, the ESC further including an annular step surrounding the top surface, the annular step defining an annular shelf at a lower height than the top surface, the annular shelf configured to accommodate an edge ring assembly, the edge ring assembly including an edge ring configured to surround the ESC, the edge ring assembly further including a dielectric ring; a bias electrode disposed within the ESC, the bias electrode configured to receive RF power from a first RF power supply to generate a bias voltage on the substrate; an annular electrode disposed within the ESC, the annular electrode being disposed below a peripheral region of the top surface of the ESC; and a plurality of insulated connectors disposed through the ESC, each of the plurality of insulated connectors configured to provide electrical connection between a second RF power supply and the annular electrode; wherein the dielectric ring is disposed below the annular electrode and over the annular shelf.

In one implementation, the annular electrode and the plurality of insulated connectors are configured to isolate the second RF power supply from the first RF power supply.

In one implementation, a first portion of the annular electrode is disposed below the substrate when present on the top surface of the ESC, and wherein a second portion of the annular electrode extends radially beyond a diameter of the substrate.

In one implementation, the first RF power supply and the second RF power supply are configured to provide respective RF powers at a predefined phase angle difference. The phase angle difference can be dynamically tuned to achieve desirable ion flux and consequent etch profiles.

BRIEF DESCRIPTION OF THE DRAWINGS

FIG. 2B-2 illustrates a cutaway view of an ESC and edge ring assembly, in accordance with implementations of the disclosure.

FIGS. 4A, 4B, 4C, 4D, and 4E illustrate cross-sectional views of the edge region of a substrate undergoing plasma processing, in accordance with implementations of the disclosure.

DESCRIPTION

Figure 1A:
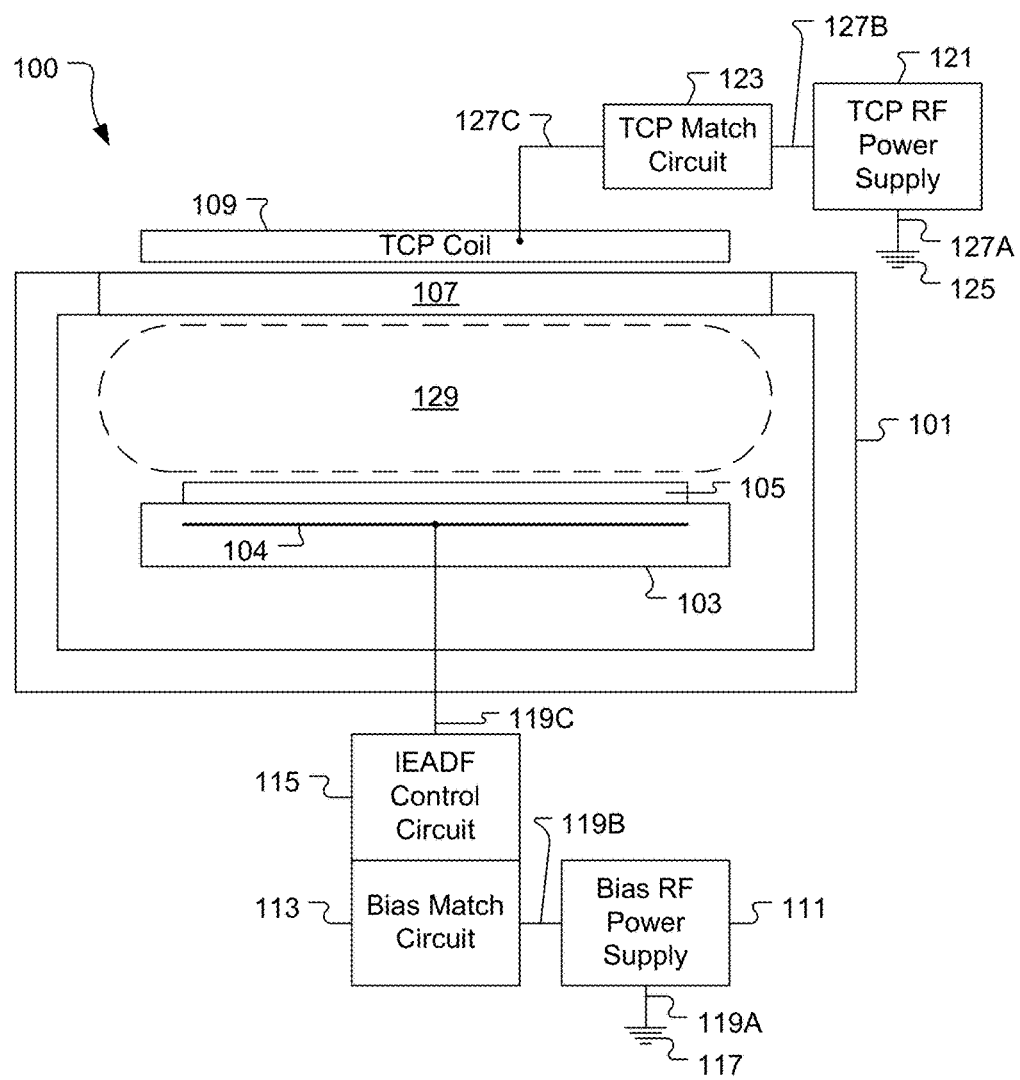
FIG. 1A shows an architectural view of a plasma processing system 100 for etching operations, in accordance with one embodiment of the present disclosure.

Embodiments of the disclosure provide methods, apparatus, and systems for enabling extreme edge sheath and wafer profile tuning through edge-localized ion trajectory control and plasma operation. It should be appreciated that the present embodiments can be implemented in numerous ways, such as a process, an apparatus, a system, a device, or a method. Several embodiments are described below.

In some implementations, extreme wafer edge control of ion flux and trajectories is achieved through a RF powered edge ring assembly wherein an electrode is embedded inside the edge ring assembly surrounding the wafer or the extreme edge of the electrostatic chuck (ESC) ceramic and powering the electrode at low RF frequencies (such as 400 kHz, 2 MHz-~13.56 MHz). The electrode can be fabricated inside of the edge ring, or may be sandwiched between dielectrics, so long as the electrode is electrically separated from the ESC and provided with RF power that is separately controllable from that on the ESC. As discussed in further detail below, RF power can be provided through feeds that may be defined in the periphery of the ESC.

By using sufficiently high voltage on the embedded electrode, the plasma sheath boundary in the vicinity of the extreme wafer edge can be modified by enabling a sheath continuity over the edge ring. The presence of the modified sheath boundary due to the RF powered edge ring reduces ion tilting and ion focusing at the wafer edge. The application of the RF voltage in the buried electrodes can be in phase with the main RF supply to the ESC or can be with a phase difference. Utilizing a phase difference between the two RF voltages will create a lateral electric field near the wafer edge which can cause the sheath to be modified in a way that will control the ion trajectories at the extreme wafer edge.

The RF powered edge ring assembly is disposed in an area around the ESC so that the plasma at and near the wafer edge can be influenced. The influence on the plasma can assist to provide uniformity and continuity of a plasma sheath in areas near the edge exclusion and out to the physical edge of the wafer. An advantage of providing uniformity up to and including the exclusion is that more usable integrated circuits can be defined per wafer, which increases fabrication yield.

Higher voltages are gained by using low RF frequencies while high plasma densities can be achieved by using higher RF frequencies. In case of generating local passivation species at extreme wafer edge one could design a powered edge ring with high RF frequency≥27 MHz though this may not be desirable at all times. Specifically for voltage control and modifying the sheath boundary, RF frequencies in a lower range (400 kHz-13.56 MHz) can be utilized. In other embodiments, an extended ESC ceramic step can be utilized to accommodate the buried electrode such that there is a radial overlap between the electrode and the edge ring periphery to manipulate the sheath over the wafer edge.

Extreme wafer edge control is possible through a low-frequency RF powered edge ring that controls the voltage over the edge ring and affects the capacitive coupling at the extreme wafer edge. This provides a technical advantage in that the effects of extreme wafer edge electrical and chemical discontinuities are mitigated.

Figure 1B:
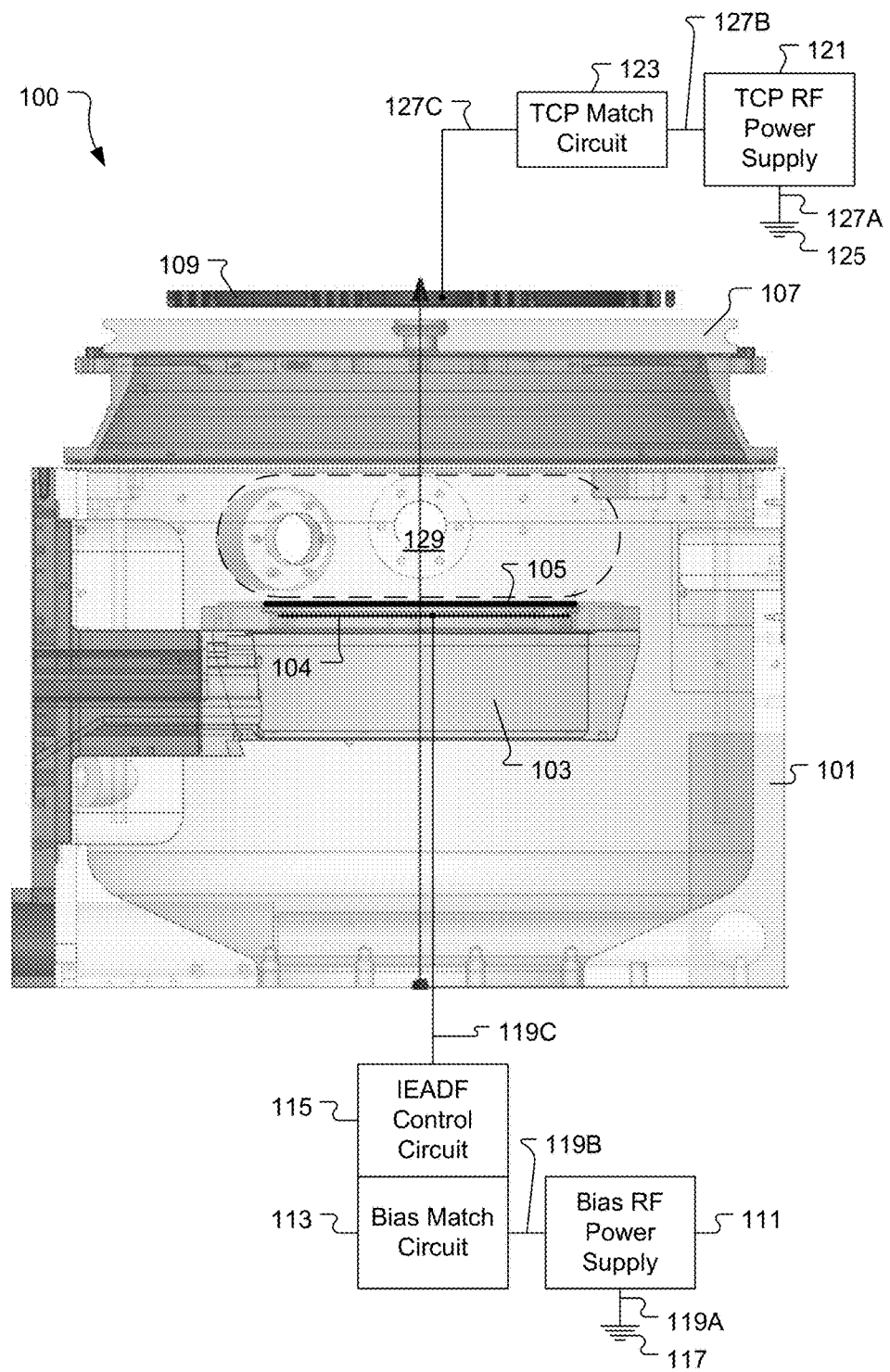
FIG. 1B shows a design view of the plasma processing system 100, in accordance with one embodiment of the present disclosure.

FIG. 1A shows an architectural view of a plasma processing system 100 for etching operations, in accordance with one embodiment of the present disclosure. FIG. 1B shows a design view of the plasma processing system 100, in accordance with one embodiment of the present disclosure. The plasma processing system 100 includes a chamber 101 that includes a ESC 103, and a dielectric window 107. Though the ESC 103 in the embodiment of FIG. 1B is supported from a side arm extending from a side of the chamber 101, it will be appreciated that the ESC 103 can also be supported from the bottom, via a support extending from the base of the chamber 101, or through a lower side opening. Furthermore, RF power can be supplied to the ESC 103 from the bottom of the ESC 103, and such RF power can be symmetrically delivered to the ESC 103. The ESC 103 is defined to support a substrate 105 during plasma processing operations. A substrate, as referred to herein, denotes without limitation, semiconductor wafers, hard drive disks, optical discs, glass substrates, flat panel display surfaces, liquid crystal display surfaces, among essentially any other type of substrate present during semiconductor device fabrication. In one embodiment, the ESC 103 is an electrostatic chuck for supporting and holding the substrate 105. In another embodiment, the ESC 103 is defined to hold the substrate 105 by physical restraint. The ESC 103 includes one or more bias electrodes 104 (bias electrode 104 hereafter) connected to receive radiofrequency (RF) power from a bias RF power supply 111, by way of a bias match circuit 113 and an ion energy and angular distribution function (IEADF) control circuit 115. The bias RF power supply 111 is connected between a reference ground potential 117 and the bias match circuit 113, as indicated by electrical connections 119A and 119B. The bias match circuit 113 is electrically connected to the IEADF control circuit 115, which is in turn electrically connected to the bias electrode 104, as indicated by electrical connection 119C.

The ESC 103 includes clamp electrodes (not shown) to enable the chucking and de-chucking of the substrate 105. Also, in this embodiment, a filter and a direct current (DC) clamp power supply are provided to effect electrostatic clamping of the substrate 105 to the ESC 103 by way of the clamp electrodes. Also, the ESC 103 can include other control systems, such as lifting pins or the like, for receiving the substrate 105, lowering the substrate 105 onto the ESC 103, and lifting the substrate 105 off of the ESC 103. Additionally, although not shown, pumps are connected to the chamber 101 to provide for control of pressure within the chamber 101, and for exhausting of gaseous byproducts from the chamber 101 during plasma processing operations.

In various embodiments, the dielectric window 107 is defined from a dielectric material, such as a ceramic material or quartz, among others. It should be understood that in other embodiments the dielectric window 107 can be defined from other dielectric materials, so long as the dielectric window 107 is capable of withstanding the conditions to which it is exposed during plasma processing operations within the chamber 101. In some plasma processing operations, the chamber 101 is operated at elevated temperatures within a temperature range extending from about 50 Celsius (C) to about 120 C. In general, the temperature within the chamber 101 will depend on the specific etching process performed. Also, the chamber 101 can operate at reduced-pressure conditions within a pressure range extending from about 1 milliTorr (mT) to about 100 mT.

The plasma processing system 100 also includes a TCP (transformer coupled plasma) coil 109 disposed over the dielectric window 107 outside the chamber 101. The TCP coil 109 is connected to receive RF power from a TCP RF power supply 121, by way of a TCP match circuit 123. Specifically, the TCP RF power supply 121 is electrically connected between a reference ground potential 125 and the TCP match circuit 123, as indicated by electrical connections 127A and 127B. The TCP match circuit 123 is electrically connected between the TCP RF power supply 121 and the TCP coil 109, as indicated by electrical connections 127B and 127C. The TCP match circuit 123 is defined to control an impedance of the RF power transmission path to the TCP coil 109, so as to provide for efficient transmission of the RF power to the TCP coil 109.

During plasma processing operations, a process gas is flowed into the chamber 101, and RF power is supplied from the TCP RF power supply 121 to the TCP coil 109. The RF power passing through the TCP coil 109 induces an electromagnetic current in the chamber 101, which acts on the process gas to generate the plasma 129. In this manner, the TCP coil 109 behaves as a primary coil of a transformer, and the plasma 129 behaves as a secondary coil of the transformer. The plasma 129 includes reactive constituents, such as radicals and ions (positive and negative), which act to remove, i.e., etch, materials from the substrate 105 upon contact with the substrate 105.

It should be understood that when the chamber 101 is installed in a fabrication facility, the chamber 101 is coupled to systems that provide for supply of process gases to the chamber 101, exhaust of process gases and byproducts from the chamber 101, monitoring and control of pressure within the chamber 101, monitoring and control of temperature within the chamber 101, and environmental particle control. Also, it should be understood that the chamber 101 can be coupled to a transfer chamber defined to provide for robotic transfer of the substrate 105 into the chamber 101 and robotic removal of the substrate 105 from the chamber 101.

During operation, RF power is transmitted from the bias RF power supply 111 to the bias electrode 104, by way of the bias match circuit 113 and IEADF control circuit 115, to generate and control a direct current (DC) bias voltage present on the substrate 105, which in turns controls a force exerted on an ion population present within the plasma 129 generated above the substrate 105. The RF power transmitted to the bias electrode 104 corresponds to an RF bias voltage applied to the bias electrode 104. Both the DC bias voltage that builds up on the substrate 105 and the RF bias voltage applied to the bias electrode 104 occur simultaneously as a result of applying the RF power from the bias RF power supply 111 to the bias electrode 104, by way of the bias match circuit 113 and IEADF control circuit 115. Therefore, the IEADF control circuit 115 within the bias RF power supply affects both the DC bias voltage on the substrate 105 and the RF bias voltage on the bias electrode 104.

The DC bias voltage is a representation of the average ion energy at a particular point on the substrate 105. The DC bias voltage builds up on the substrate 105 as substrate 105 charging occurs. The IEADF control circuit 115 controls the rate at which the DC bias voltage evolves in a pulsed bias RF power supply mode. In a continuous wave (CW) bias RF power supply mode, the DC bias voltage on the substrate 105 is allowed to reach a steady-state. Therefore, in the CW bias RF power supply mode, the effect of the IEADF control circuit 115 on the DC bias voltage on the substrate 105 is not relevant. Also, it should be understood that the RF waveform seen at the plasma 129 sheath edge (after the bias match circuit 113 and all the capacitive layers in the ESC 103) will be controlled by the IEADF control circuit 115. And, ions respond to the RF waveform at the plasma 129 sheath edge to populate the IEADF accordingly as the ions accelerate toward the substrate 105.

In various embodiments, the RF power supply 111 can be defined to include either a single RF generator or multiple RF generators. Also, the RF power supply 111 can be defined to generate RF power at one or more frequencies. And, in the case of multiple RF generators, the RF power supply 111 can generate RF power at multiple frequencies in a simultaneous manner. The bias match circuit 113 is defined to control an impedance of the RF power transmission path to the bias electrode 104, so as to provide for efficient transmission of the RF power to the bias electrode 104.

The chamber 101 utilizes the RF bias power as generated by the RF power supply 111 at various frequencies to generate and control the energetic ion population arriving at the exposed surface of the substrate 105 during plasma processing operations. Depending on the particular etch application being performed, it may be important to control the fraction of ion population at various energies and the associated ion energy and angular distribution functions (IEADF) arriving at the substrate 105. Pulsing of the bias RF power supply 111, i.e., bias pulsing, can be utilized to generate an IEADF at the substrate 105. Bias pulsing operation causes transit of ion populations from various energies toward the substrate 105 over a time period associated with a pulse repetition frequency (PRF) and a pulse duty cycle (D.C.) of the supplied bias RF power. However, it is also necessary during bias pulsing operation to control the IEADF to which the substrate 105 is exposed in order to obtain a specific plasma processing result on the substrate 105. In accordance with various embodiments of the present disclosure, the IEADF circuit 115 is defined and operated to control the IEADF during bias pulsing operation in order to control populations of low and high energy ions to which the substrate 105 is exposed.

As discussed, the bias RF power is supplied from the bias RF power supply 111, through the bias match circuit 113, through the IEADF circuit 115, to the bias electrode 104. From the bias electrode 104, the bias RF power is transmitted through the plasma 129 to surrounding structures of the chamber 101 that are electrically grounded. Circuit components within the bias match circuit 113 provide impedance matching to enable efficient transmission of the bias RF power through the plasma 129. The bias RF power supply 111 can be operated in either continuous wave bias RF power supply mode or pulsed bias RF power supply mode.

Figure 2A:
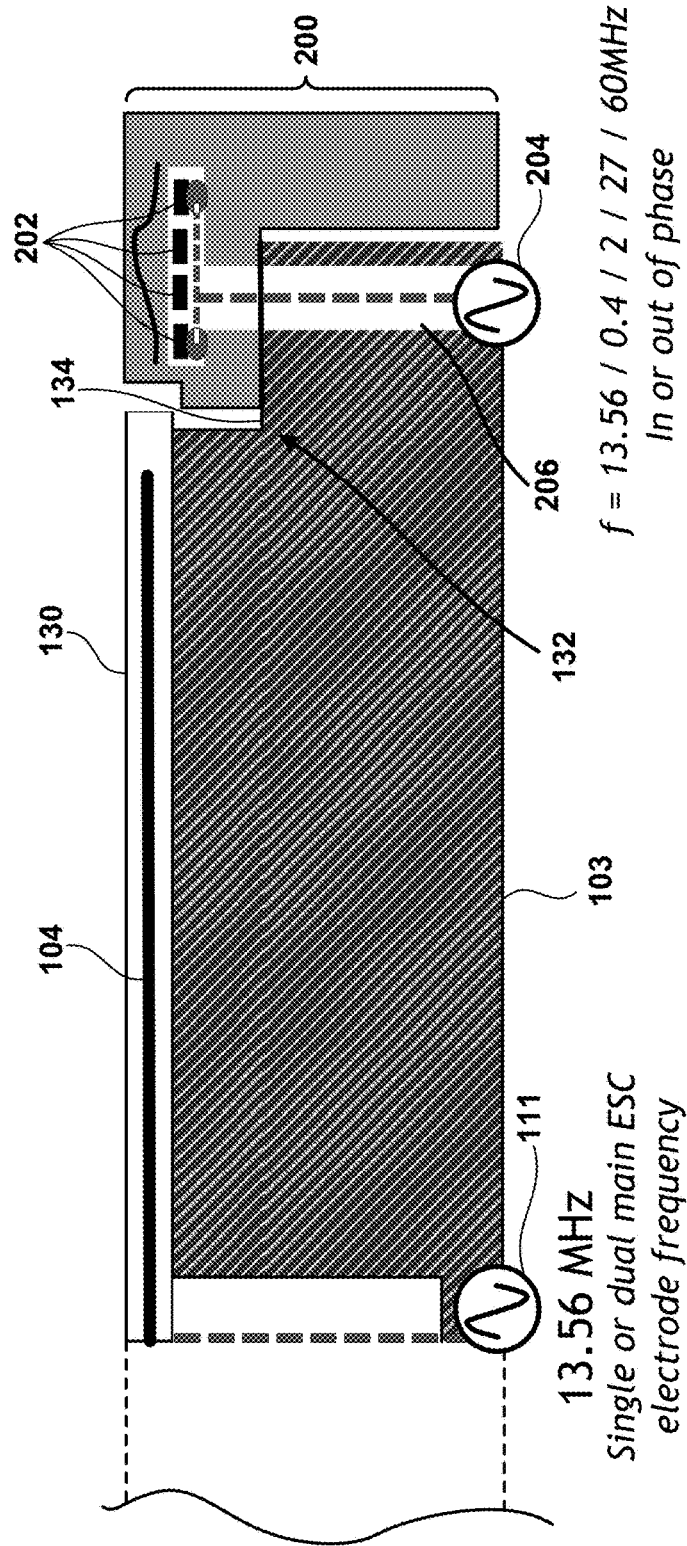
FIG. 2A conceptually illustrates a cross-section of an electrostatic chuck (ESC) and an edge ring assembly, that are configured to be disposed within a plasma process chamber, in accordance with implementations of the disclosure.

FIG. 2A conceptually illustrates a cross-section of an electrostatic chuck (ESC) and an edge ring, that are configured to be disposed within a plasma process chamber, in accordance with implementations of the disclosure. In the illustrated implementation, the ESC 103 has a top surface 130 that is configured to support a substrate (not shown) during plasma processing. Also shown is the bias electrode 104 that is disposed below the top surface 130 of the ESC 103. The bias electrode 104 receives RF power from the bias RF power supply 111. In some implementations, the bias RF power supply 111 is operated at a frequency of 13.56 MHz, though in other implementations, the bias RF power supply 111 can be operated at other frequencies suitable for the plasma process being performed.

The ESC 103 has an annular step 132 that defines an annular shelf 134. The height of the annular shelf 134 is lower than the height of the top surface 130 of the ESC 103. An edge ring assembly 200 is at least partially positioned over the annular shelf 134 defined by the annular step 132.

In the illustrated implementation, the edge ring assembly 200 includes an annular electrode 202 that receives power from an RF source/generator 204. In some implementations, the annular electrode 202 is fully encapsulated/buried within the edge ring assembly 200. That is, no surface of the annular electrode 202 is exposed to the chamber environment during plasma processing. In some implementations, the annular electrode 202 is defined as a singular annular structure composed of a solid piece of a conductive material (e.g. copper, aluminum, conductive alloys, etc.). The annular electrode 202 in such an implementation can have a flattened ring-shaped structure.

While the annular electrode 202 of the above-described implementation can have a continuously solid annular structure, it will be appreciated that in other implementations, the annular electrode 202 can have other types of structures, such as a non-circumferentially continuous annular structure composed of several radial segments, a porous structure having holes distributed throughout, a mesh-like structure, an interwoven structure of conductive strands/ribbons/etc., a grill-like structure defining several interconnected elements (e.g. several concentric annular elements with interconnections), etc.

In some implementations, a plurality of concentrically arranged annular electrodes are embedded in the edge ring assembly 200. Each of these annular electrodes can be powered by the same RF source/generator 204, or by separate RF sources/generators. Moreover, the RF power of each electrode may be individually tuned and may be powered at different voltages/frequencies.

As noted above, in one implementation, the bias electrode 104 is powered at a frequency of 13.56 MHz. The annular electrode 202 may be powered at the same frequency (13.56 MHz in the instant example) as the bias electrode 104, or at a different frequency (e.g. 0.4 MHz, 1 MHz, 2 MHz, 27 MHz, 60 MHz, etc.). Additionally, the RF power applied to the bias electrode 104 can be continuous wave or pulsed. When the RF power applied to the bias electrode 104 is continuous wave, the RF power applied to the annular electrode 202 should be continuous wave, also. When the RF power applied to the bias electrode 104 is pulsed, then the RF power applied to the annular electrode 202 may be pulsed or continuous wave.

With continued reference to FIG. 2A, also shown is an edge ring RF feed 206 that is defined within and which passes through the ESC 103. The edge ring RF feed 206 is electrically connected to the RF source 204, and is configured to deliver RF power from the RF source 204 to the edge ring assembly 200, and more specifically to the annular electrode 202 disposed within the edge ring assembly 200. Though a single edge ring RF feed 206 is shown, it will be appreciated that there may be several such RF feed structures positioned within the ESC 103. In some implementations, a plurality of edge ring RF feed structures are symmetrically positioned about the ESC 103. The edge ring RF feed can be defined by an insulated coaxial connector that is configured to provide for electrical isolation from the ESC 103.

In one implementation, the edge ring RF feed 206 is configured to extend through the ESC 103 and through a through-hole (further described below) defined in the edge ring assembly 200 to connect to the annular electrode 202.

In one implementation, the edge ring RF feed 206 extends to the annular shelf 134, where it makes connection to another connector that is connected to the annular electrode 202. It will be appreciated that as there may be several edge ring RF feeds 206, there may likewise be several such corresponding connection points. The edge ring RF feed 206 should be shielded from the rest of the ESC 103, and therefore in some implementations, the edge ring RF feed 206 is insulated and/or defined as a coaxial connector/cable.

Figures 1, 2B:
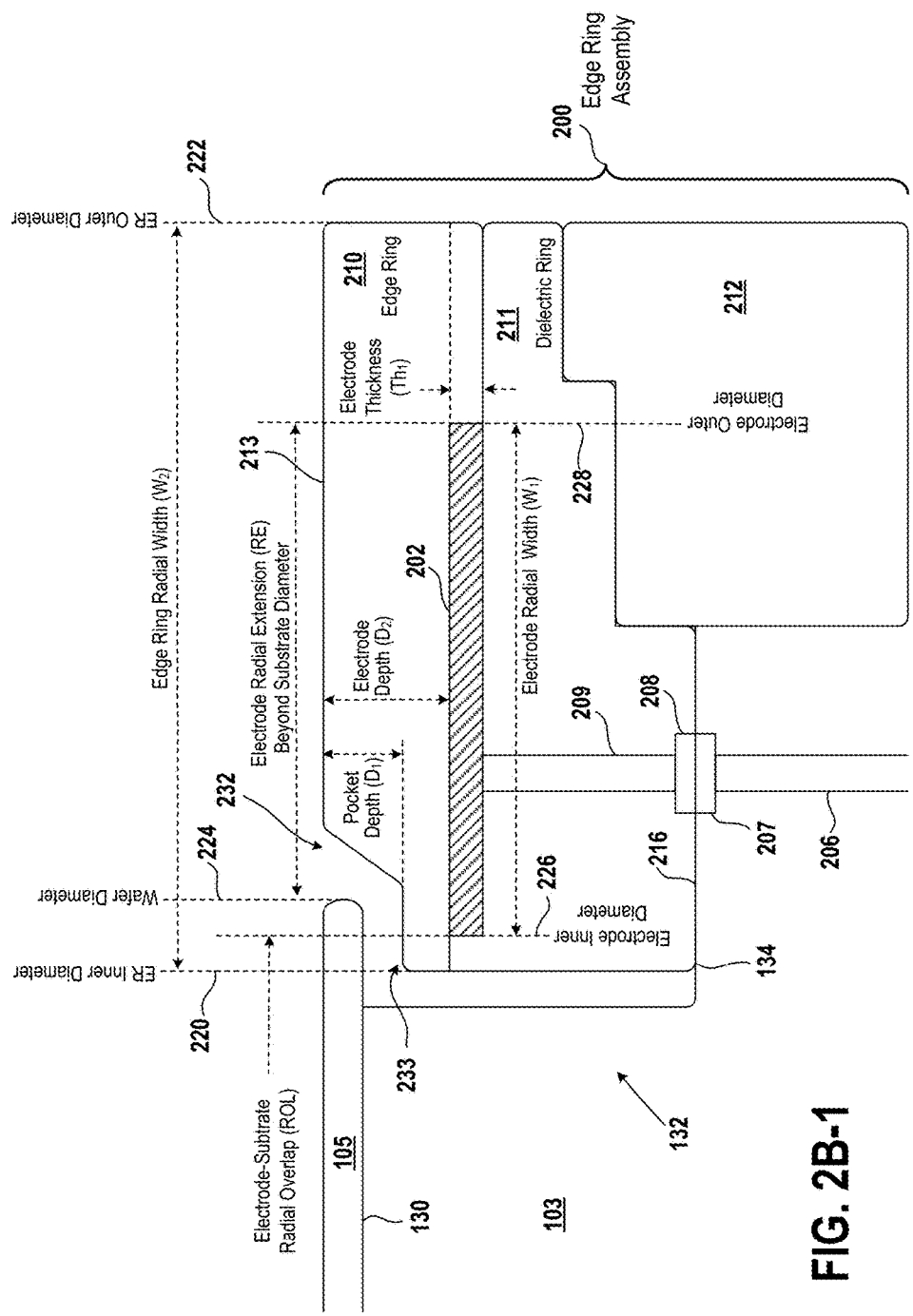
FIG. 2B-1 illustrates a magnified cross-sectional view of an ESC and edge ring assembly, in accordance with implementations of the disclosure.

FIG. 2B-1 illustrates a magnified cross-sectional view of the edge ring assembly 200, in accordance with implementations of the disclosure. In some implementations, the edge ring assembly 200 includes an edge ring 210 having a top surface 213, as well as a dielectric ring 211 that is positioned below the edge ring 210. A portion 212 is further positioned below the dielectric ring 211. The annular electrode 202 is positioned between the edge ring 210 and the dielectric ring 211.

Broadly speaking, the edge ring 210 has an annular shaped structure that extends from an inner diameter (ref. 220) to an outer diameter (ref. 222). The inner diameter of the edge ring 210 can be less than or greater than a diameter of the substrate/wafer 105. A stepped edge 232 is defined at the inner diameter of the edge ring 210, and defines a step down from a top surface 213 of the edge ring 210. A lower portion 233 of the stepped edge 232 is defined to be at a lower height than the top surface 130 of the ESC 103, so that the substrate 105 extends over the lower portion 233. The difference in height between the lower portion 233 and the top surface 213 defines a pocket depth $D_1$ as shown in the illustrated implementation. In some implementations, the pocket depth $D_1$ is in the range of about 2.5 to 3 mm. In some implementations, the pocket depth $D_1$ is about 2.75 mm. In some implementations, the pocket depth $D_1$ is in the range of about 0.7 to 4.5 mm. It will be appreciated that in various implementations, the various portions of the edge ring assembly 200 can be composed of materials such as quartz, SiC, etc.

The annular electrode 202 is embedded within the annular structure of the edge ring 210. It will be appreciated that the dimensions of the annular electrode 202 may vary in different implementations. In accordance with some implementations as in the illustrated embodiment, the annular electrode 202 has a radial width ($W_1$) (radial distance from an inner diameter of the electrode to an outer diameter of the electrode) of about 5 to 28 millimeters (mm) In some implementations, the annular electrode 202 has a radial width ($W_1$) of about 10 to 20 mm. In some implementations, the annular electrode 202 has a radial width ($W_1$) of about 10 to 15 mm. In various implementations, the inner diameter 226 of the annular electrode 202 can be equal to or greater than the inner diameter 220 of the edge ring 210. In various implementations, the outer diameter 228 of the annular electrode 202 can be equal to or less than the outer diameter 222 of the edge ring 210. Thus, the radial width $W_1$ of the annular electrode 202 can be less than or equal to the radial width $W_2$ of the edge ring 210.

In some implementations, the annular electrode 202 is defined as having a minimum radial width ($W_1$) of at least about 10 to 15 mm. The minimum radial width may be defined to provide for a desired level of extension of the plasma sheath over the edge ring 210.

In some implementations, the annular electrode 202 has a thickness of about 0.5 mm to 10 mm. In some implementations, the annular electrode 202 has a thickness of about 0.75 mm to 5 mm. In some implementations, the annular electrode 202 has a thickness of about 2 to 3 mm. In the illustrated implementation, the annular electrode 202 may have a minimum inner diameter equivalent to the edge ring's inner diameter (ref. 220), and the annular electrode 202 may have a maximum outer diameter equivalent to the edge ring's outer diameter (ref. 222).

Furthermore, in various implementations, the height of the top surface of the annular electrode 202 may be at, above, or below the height of the top surface 130 of the ESC 103. In some implementations, the height of the top surface of the annular electrode 202 is configured to be 0 to 5 mm above or below the height of the top surface 130 of the ESC 103. In other implementations, the height of the top surface of the annular electrode 202 can be defined with reference to the top surface of the substrate (when resting on the top surface 130 of the ESC 103), and the height of the top surface of the annular electrode 202 may be configured to be at, above, or below the height of the top surface of the substrate 105. In some implementations, the height of the top surface of the annular electrode 202 lies at a depth $D_2$ below the top surface 213 of the edge ring 210. In some implementations, the electrode depth $D_2$ is in the range of about 3 to 6 mm. In some implementations, the electrode depth $D_2$ is in the range of about 4 to 5 mm. In some implementations, the electrode depth $D_2$ is 4.5 mm.

A portion of the annular electrode 202 can be disposed below the stepped edge 232 of the edge ring 210. Accordingly, a portion of the annular electrode 202 may also be disposed below a portion of the substrate 105. In such implementations, the inner diameter (ref. 226) of the annular electrode 202 is less than the diameter of the substrate 105 (ref. 224), so that a radial overlap (ROL) exists between the annular electrode 202 and the substrate 105. In some implementations, the ROL between the annular electrode 202 and the substrate 105 is in the range of 0 to 3 mm. In other implementations, a minimum amount of the ROL is defined as being in the range of about 0 to 3 mm.

A related dimension is the radial extension (RE) of the annular electrode 202 beyond the substrate diameter (ref. 224). In some implementations, the RE is in the range of 5 to 25 mm. In other implementations the RE is defined as having a minimum amount in the range of about 5 to 10 mm.

In some implementations, the annular electrode 202 is connected to a connector 209 that terminates at a contact 208 that is disposed along a lower surface 216 of the dielectric ring 211. It will be appreciated that the lower surface 216 of the dielectric ring 211 is configured to be positioned over the annular shelf 134 of the ESC 103 in the chamber 101. The connector 209 can be configured to extend downward from the annular electrode 202 to the contact 208 at the lower surface 216. The contact 208 mates with a corresponding contact 207 that is positioned along the annular shelf 134 of the ESC 103, and which terminates the edge ring RF feed 206. Both the connector 209 and the edge ring RF feed 206 can be defined as insulated coaxial connectors. It will be appreciated that the contacts 207 and 208 can likewise be defined as coaxial contacts that provide for mating of the inner conductors and the tubular shield conductors of the respective edge ring RF feed 206 and connector 209. The contacts can be defined from any material providing high conductance of RF power, including copper, aluminum, silver, gold, etc. The contacts may be defined to provide outward pressure to ensure suitable surface-to-surface contact between contacts. For example, when not interfaced with another contact, a contact may exhibit protrusion from the surface (e.g. annular shelf 134 or lower surface 216).

Figures 2, 2B:
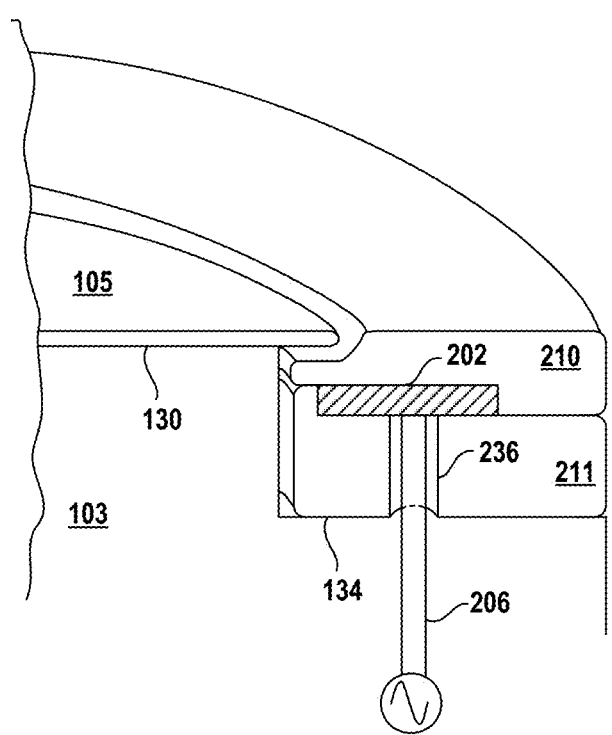

FIG. 2B-2 illustrates a cutaway view of an ESC and edge ring assembly, in accordance with implementations of the disclosure. In the illustrated implementation, the edge ring RF feed 206 is a connector that is disposed through the ESC 103, and which extends through the annular shelf 134 of the ESC 103. The edge ring RF feed 206 further extends through a through-hole 236 defined in the dielectric ring 211, to connect to the annular electrode 202.

Figure 2C:
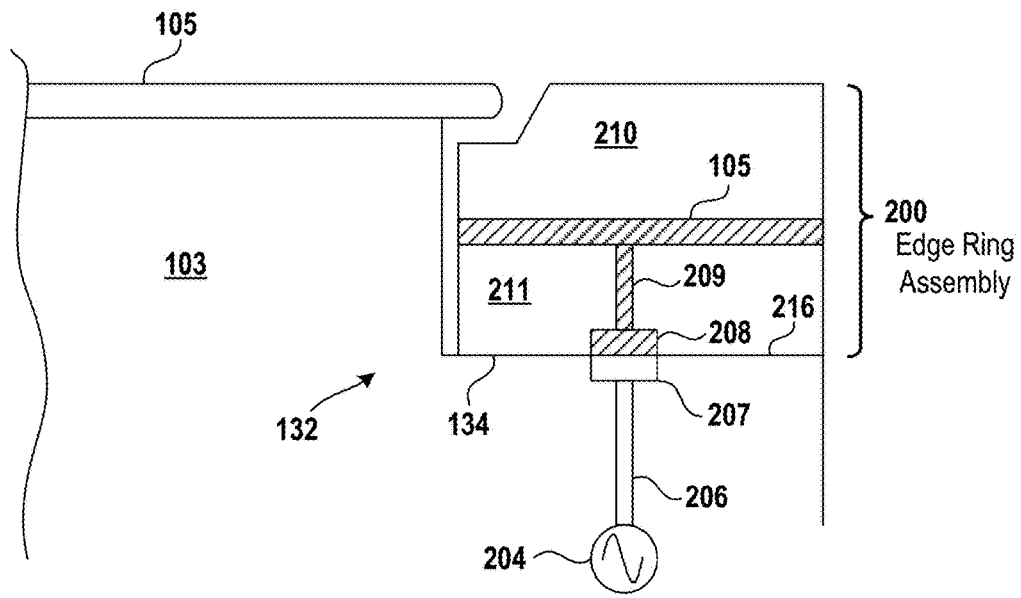
FIG. 2C illustrates a cross-section of an edge ring and ESC, in accordance with implementations of the disclosure.

FIG. 2C illustrates a cross-section of an edge ring assembly and ESC, in accordance with implementations of the disclosure. In the illustrated implementation, the edge ring assembly 200 includes an edge ring 210, and a delectric ring 211. Positioned between the edge ring 210 and dielectric ring 211 is an annular electrode 202 that extends the entire radial width of the edge ring assembly 200.

Figure 2D:
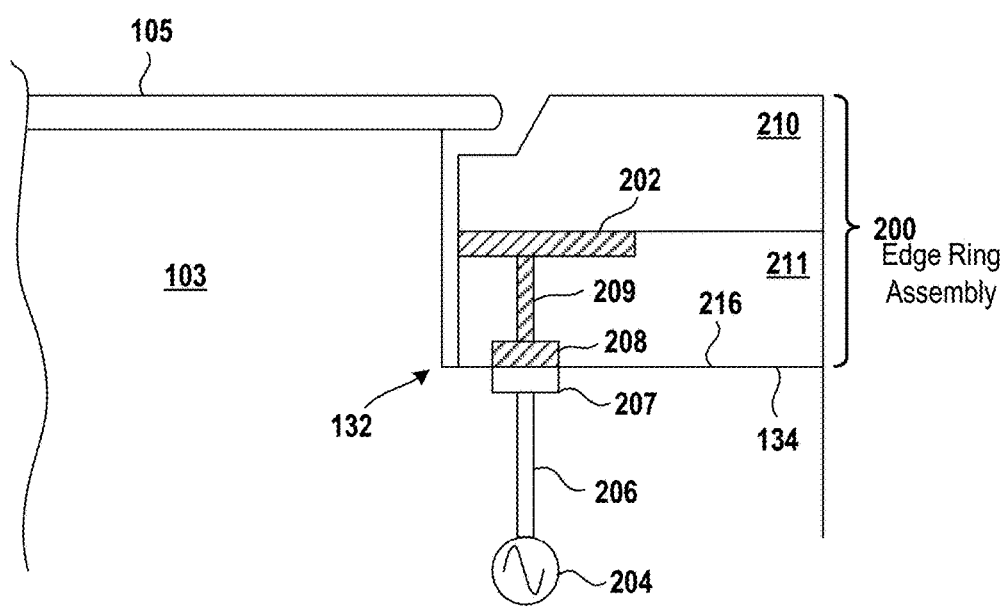
FIG. 2D illustrates a cross-section of an edge ring and ESC, in accordance with implementations of the disclosure.

FIG. 2D illustrates a cross-section of an edge ring assembly and ESC, in accordance with implementations of the disclosure. In the illustrated implementation, the edge ring assembly 200 includes an edge ring 210, and a dielectric ring 211. Positioned between the edge ring 210 and dielectric ring 211 is an annular electrode 202 that extends from the inner diameter of the edge ring 210, but having a radial width that is less than the entire radial width of the edge ring assembly 200.

Figure 2E:
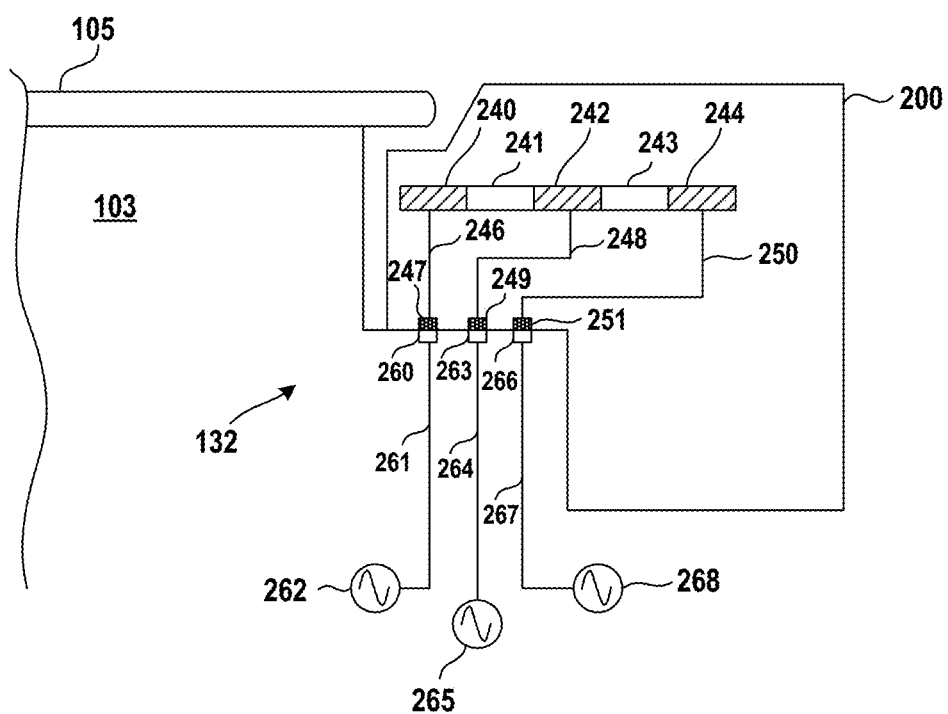
FIG. 2E illustrates a cross-section of an edge ring having a plurality of concentric electrodes embedded therein, in accordance with implementations of the disclosure.

FIG. 2E illustrates a cross-section of an edge ring assembly having a plurality of concentric electrodes embedded therein, in accordance with implementations of the disclosure. In the illustrated implementation, a plurality of concentric annular electrodes 240, 242, and 244 are defined within the edge ring assembly 200. The concentric annular electrodes 240, 242, and 244 are separated by dielectric regions 241 and 243. The concentric annular electrode 240 is connected via a connector 246 to a contact 247; the concentric annular electrode 242 is connected via a connector 248 to a contact 249; and the concentric annular electrode 244 is connected via a connector 250 to a contact 251.

An RF source 262 supplies RF power to the concentric annular electrode 240, via an RF feed 261 terminating at a contact 260 that mates with the contact 247. An RF source 265 supplies RF power to the concentric annular electrode 242, via an RF feed 264 terminating at a contact 263 that mates with the contact 249. An RF source 268 supplies RF power to the concentric annular electrode 244, via an RF feed 267 terminating at a contact 266 that mates with the contact 251. It will be appreciated that the RF power supplied to each of the concentric annular electrodes 240, 242, and 244 can be individually tuned to achieve desired plasma sheath characteristics and etch characteristics at the edge region of substrate 105.

Figure 3A:
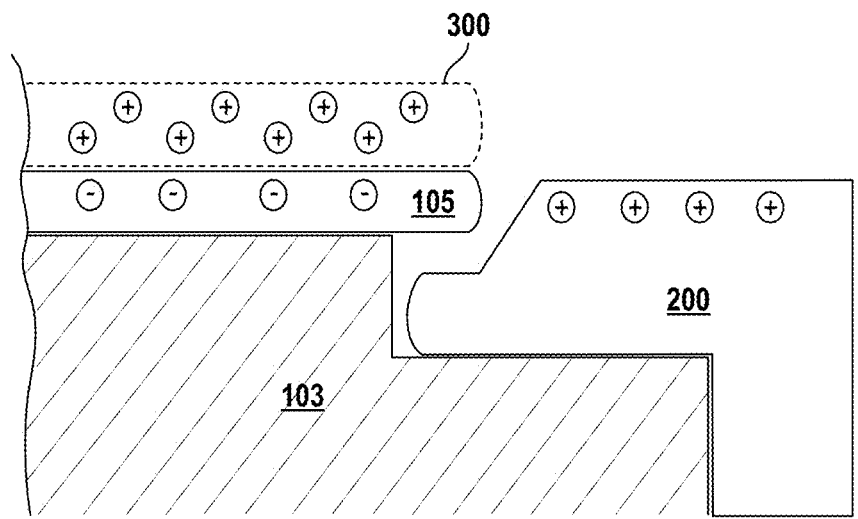
FIG. 3A conceptually illustrates a plasma sheath generated during a plasma process operation, in accordance with implementations of the disclosure.

FIG. 3A conceptually illustrates a plasma sheath generated during a plasma process operation, in accordance with implementations of the disclosure. Broadly speaking, due to the bias voltage applied to the ESC 103, the top surface of the substrate 105 is negatively charged. Hence, a plasma sheath 300 defining a layer having an increased density of positive ions is generated substantially over the top surface of the substrate 105. However, the exposed surfaces of the edge ring assembly 200 may be positively charged, and thus the plasma sheath 300 does not extend significantly beyond the edge of the substrate 105. This discontinuity of the plasma sheath at the substrate edge causes the reactive ion trajectory and density along the top surface at the edge of the substrate 105 to differ markedly from the trajectory and density at more centrally located regions for which the plasma sheath is continuous and consistently defined.

Figure 3B:
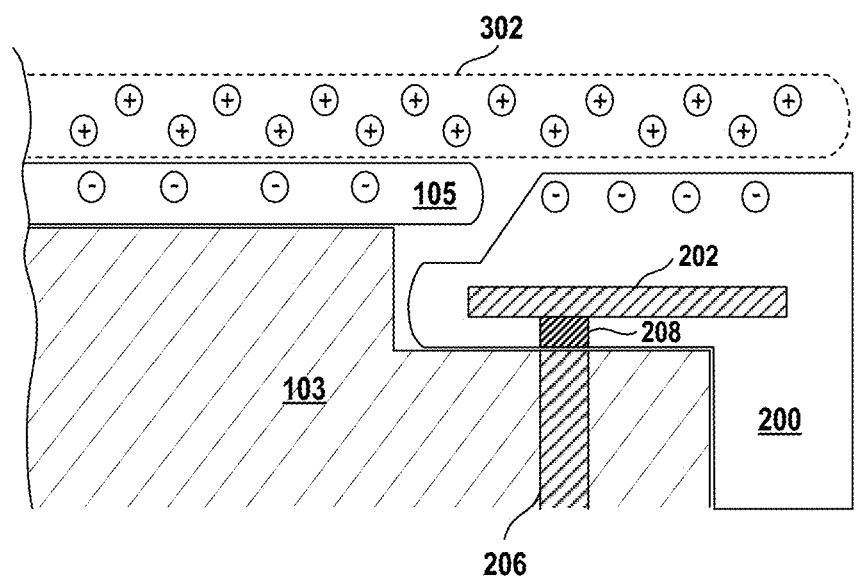
FIG. 3B conceptually illustrates a plasma sheath generated during a plasma process operation, in accordance with implementations of the disclosure.

FIG. 3B conceptually illustrates a plasma sheath generated during a plasma process operation, in accordance with implementations of the disclosure. In the illustrated implementation, the edge ring assembly 200 includes the annular electrode 202, to which RF power is applied. This causes the exposed upper surfaces of the edge ring assembly 200 to exhibit a negative charge, which extends the plasma sheath 302 radially outward so as to be defined in a region substantially over the edge ring assembly 200. The provision of a radial extension of the plasma sheath 302 provides for reduced ion focusing and less ion trajectory tilting relative to normal to the top surface of the substrate 105.

FIGS. 4A, 4B, 4C, 4D, and 4E illustrate cross-sectional views of the edge region of a substrate undergoing plasma processing, in accordance with implementations of the disclosure. FIGS. 4A-4E illustrate the voltage gradients and ion trajectories (ion flux lines shown) resulting from applying RF power to an annular electrode 202 at various voltages. For each of FIGS. 4A-4E, plasma is generated at a pressure of 10 mT, an inductive coil power of 900 W (Watt), a gas flow of 200 sccm (standard cubic centimeters) of Argon (Ar), and an RF bias voltage of 200V (Volt) applied to the bias electrode 104 at a frequency of 10 MHz. An RF voltage is applied to the annular electrode 202 at a frequency of 2 MHz.

FIGS. 4A and 4B illustrate the results when 0 V (no voltage) and 100 V are applied to the annular electrode 202, respectively. In both of these scenarios, there is significant ion focusing at the edge region of the substrate 105, as well as significant tilting of the ion trajectories at the edge region relative to normal to top surface of the substrate 105 (tilting radially inward towards the edge of the wafer). As shown at FIG. 4C, when 300 V is applied to the annular electrode 202, the ion focusing is reduced, and the tilting of the ion trajectories radially inward is reduced. As shown at FIG. 4D, when 500 V is applied to the annular electrode 202, the ion focusing and ion trajectory tilting are even further reduced. As shown at FIG. 4E, when 700 V is applied to the annular electrode 202, the ion trajectory at the edge region has begun to reverse its tilt, that is, tilting radially outward and away from the substrate edge region. Also, the ion focusing is completely eliminated, and in fact, ion diffusion is observed at the substrate edge region.

Figure 5B:
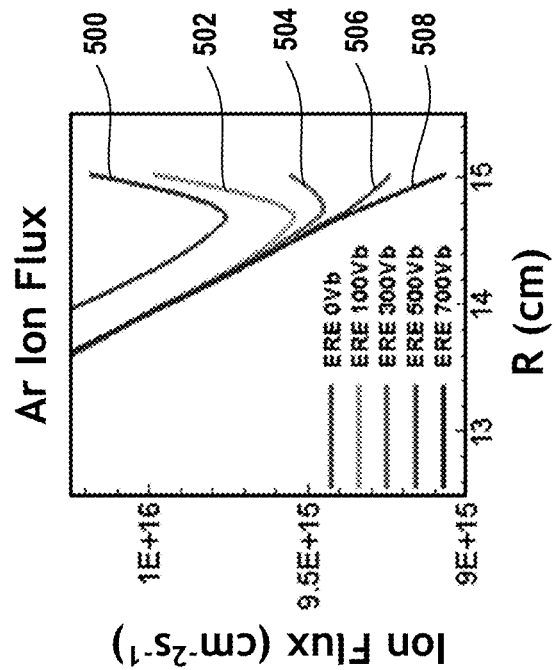
FIG. 5B illustrates a plot of Ar ion flux versus radial location along the substrate for radial locations in the range of about 13 to 15 centimeters (near the edge for a 300 mm diameter substrate), in accordance with the implementations of FIGS. 4A-4E.
Figure 5A:
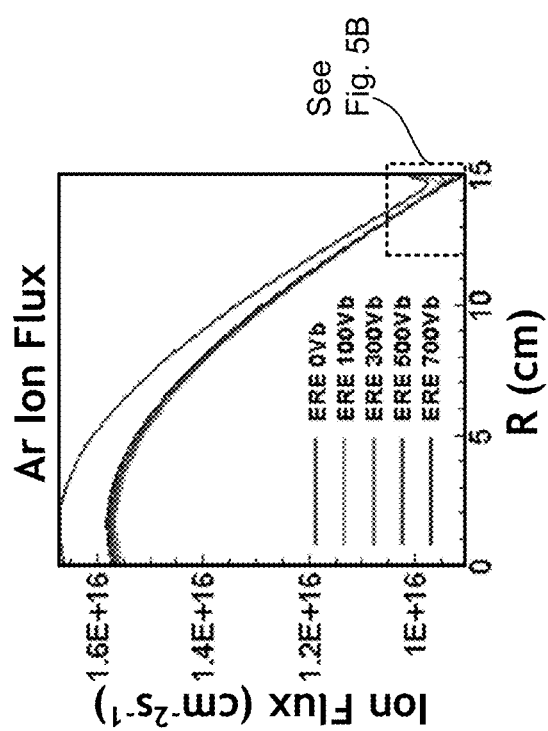
FIG. 5A illustrates a plot of Ar ion flux versus radial location along the top surface of the substrate, in accordance with the implementations of FIGS. 4A-4E.

FIG. 5A illustrates a plot of Ar ion flux versus radial location along the top surface of the substrate, in accordance with the implementations of FIGS. 4A-4E. As noted above, various voltages were applied to the annular electrode 202, and the corresponding plots of Ar ion flux are shown. As shown, the Ar ion flux for radial locations from 0 to about 14 centimeters when voltages of 100 V, 300 V, 500 V, or 700 V are applied is largely similar.

FIG. 5B illustrates a plot of Ar ion flux versus radial location along the substrate for radial locations in the range of about 13 to 15 centimeters (near the edge for a 300 mm diameter substrate). As shown, when voltages of 0 V (ref. 500), 100 V (ref. 502), and 300 V (ref. 504) are applied, the Ar ion flux increases as radial location approaches the extreme edge of the substrate (approaching 15 cm). However, when voltages of 500 V (ref. 506) and 700 V (ref. 508) are applied, the Ar ion flux decreases as radial location approaches the extreme substrate edge (approaching 15 cm).

Figure 6:
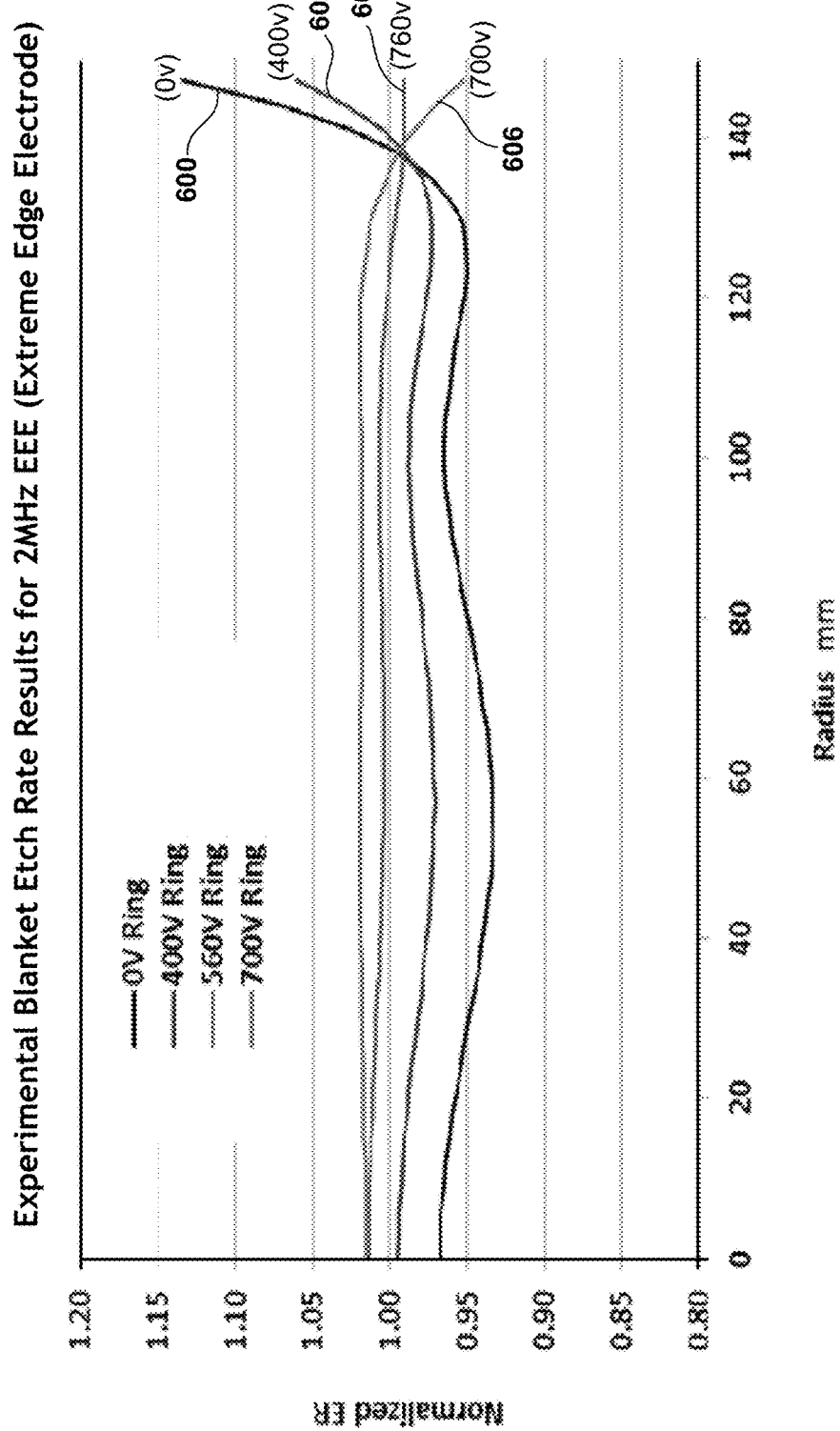
FIG. 6 illustrates a plot of normalized etch rate versus radial location along a 300 mm wafer for different applied voltages to an edge ring annular electrode, in accordance with implementations of the disclosure.

FIG. 6 illustrates a plot of normalized etch rate versus radial location along a 300 mm wafer for different applied voltages to an annular electrode, in accordance with implementations of the disclosure. Plasma processing was performed in a Kiyo EX/FX chamber (manufactured by Lam Research Corporation) on a blanket wafer under the following conditions: a pressure of 40 mT, an inductive coil (TCP) power of 900 W (Watt) (at a TCCT ratio of 1.3), a gas flow of 450 sccm (standard cubic centimeters) of HBr, 4 sccm of $O_2$, and 50 sccm of He, an ESC temperature of 60 degrees Celsius, an RF bias voltage of 450V (Volt) applied to the bias electrode 104 at a frequency of 13.56 MHz, and an RF voltage applied to the annular electrode 202 at a frequency of 2 MHz.

The curve 600 illustrates the etch rate when 0 V is applied to the annular electrode. As shown, the etch rate rises dramatically in the edge region beyond a radial location of about 135 mm. The curve 602 illustrates the etch rate when 400 V is applied to the annular electrode. As shown, the etch rate still exhibits significant increases in the edge region. The curve 604 illustrates the etch rate when 560 V is applied to the annular electrode. As shown, the etch rate is fairly consistent in the edge region. The curve 606 illustrates the etch rate when 700 V is applied to the annular electrode. As shown, the etch rate now decreases in the edge region. The experimental results shown demonstrate how the voltage applied to an annular electrode can be tuned to achieve a desired etch rate profile, e.g. to promote across-wafer uniformity.

Figure 7:
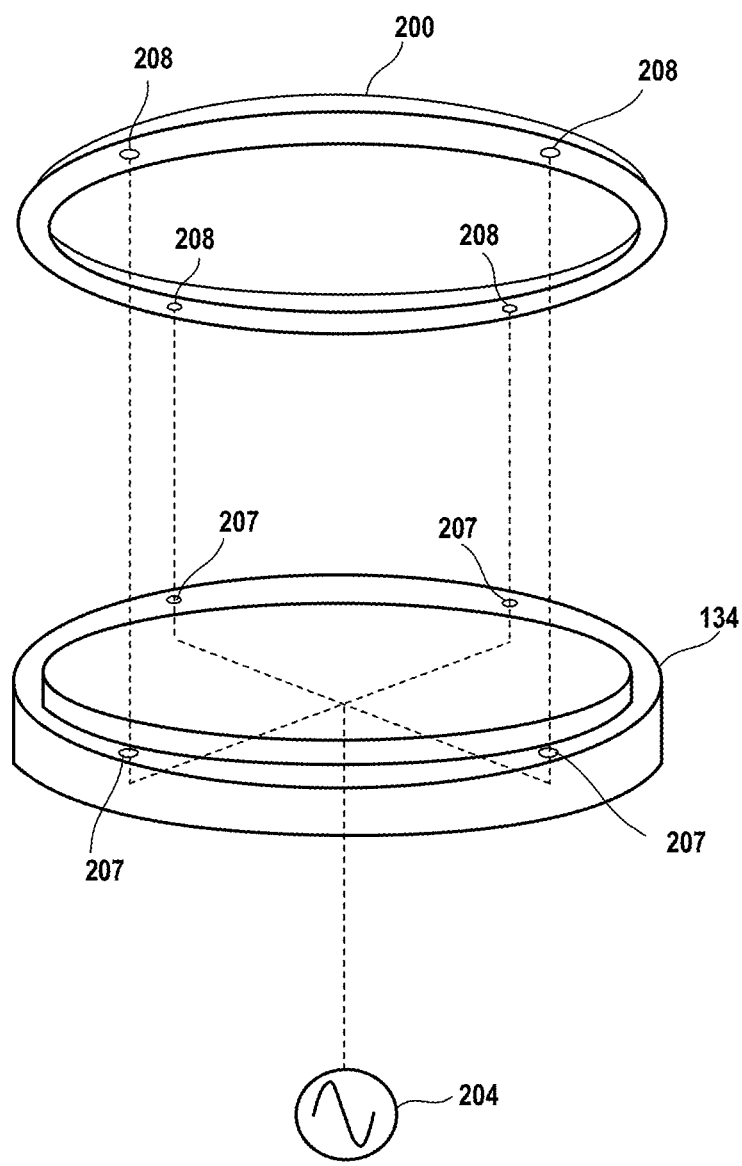
FIG. 7 illustrates an edge ring and pedestal/ESC, in accordance with implementations of the disclosure.

FIG. 7 illustrates an edge ring and pedestal/ESC, in accordance with implementations of the disclosure. In the illustrated implementation, the bottom side of the edge ring assembly 200 is shown to include electrode contacts 208, which are configured to receive RF power that is transmitted through the edge ring RF feeds 206 which are defined in the ESC 103. The electrode contacts 208 transmit the RF power to an annular electrode that is defined within the edge ring assembly 200, as described above. It will be appreciated that the edge ring RF feeds 206 in the ESC 103 are electrically isolated from the ESC 103, e.g. by a surrounding insulation sheath, as well as via a coaxial configuration. The edge ring RF feeds 206 extend to the annular shelf surface 134, and terminate at the annular shelf surface 134 to define feed contacts 207 which are configured for mating with the electrode contacts 208 of the edge ring assembly 200. The edge ring RF feeds 206 receive RF power from the RF source 204.

In the illustrated implementation, four electrode contacts 208 are symmetrically distributed about the edge ring assembly 200, and four corresponding feed contacts are symmetrically distributed about the annular shelf surface 134. However, in other implementations, there may be fewer than four contacts or more than four contacts. The specific size and shape of the contacts may vary.

In still other implementations, the edge ring RF feeds may be defined so as to extend laterally (radially) away from the ESC and may extend through sidewalls of the chamber.

Figure 8:
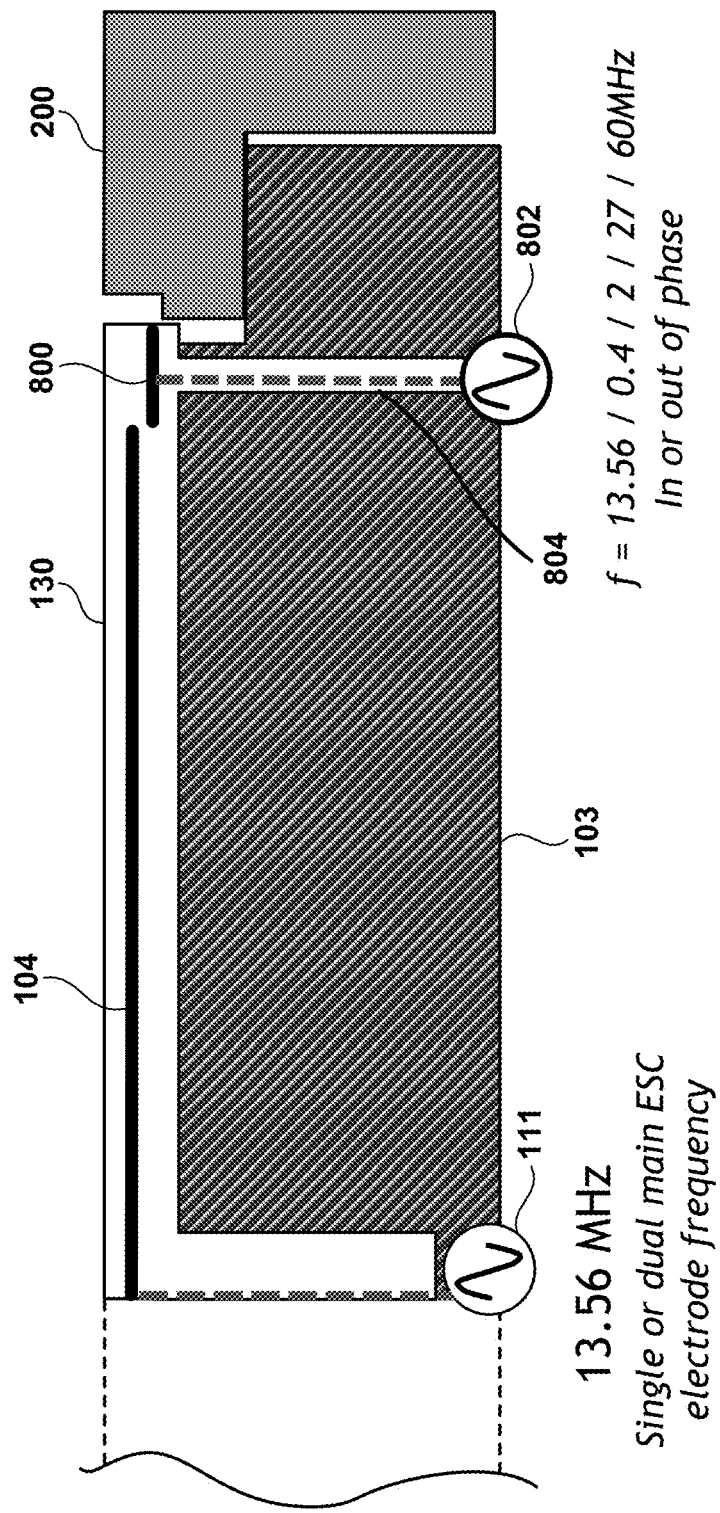
FIG. 8 conceptually illustrates a cross-section of an electrostatic chuck (ESC) and an edge ring, that are configured to be disposed within a plasma process chamber, in accordance with implementations of the disclosure.

FIG. 8 conceptually illustrates a cross-section of an electrostatic chuck (ESC) and an edge ring, that are configured to be disposed within a plasma process chamber, in accordance with implementations of the disclosure. In the illustrated implementation, the ESC 103 has a top surface 130 that is configured to support a substrate (not shown) during plasma processing. Also shown is the bias electrode 104 that is disposed below the top surface 130 of the ESC 103. The bias electrode 104 receives RF power from the bias RF power supply 111. In the instant implementation, at least the upper portion of the ESC 103 has been laterally/radially extended to accommodate an ESC annular electrode 800. The ESC annular electrode 800 is defined at a radial distance greater than the radius of the bias electrode 104, so as to surround the bias electrode 104. The ESC annular electrode 800 receives RF power from an RF source 802, via an RF feed 804. The characteristics of the RF power supplied to the annular electrode 800 can be tuned to provide for desired etch characteristics at the wafer edge region (e.g. RF power characteristics including voltage, frequency, phase relative to bias voltage, continuous wave/pulsed).

Figure 9:
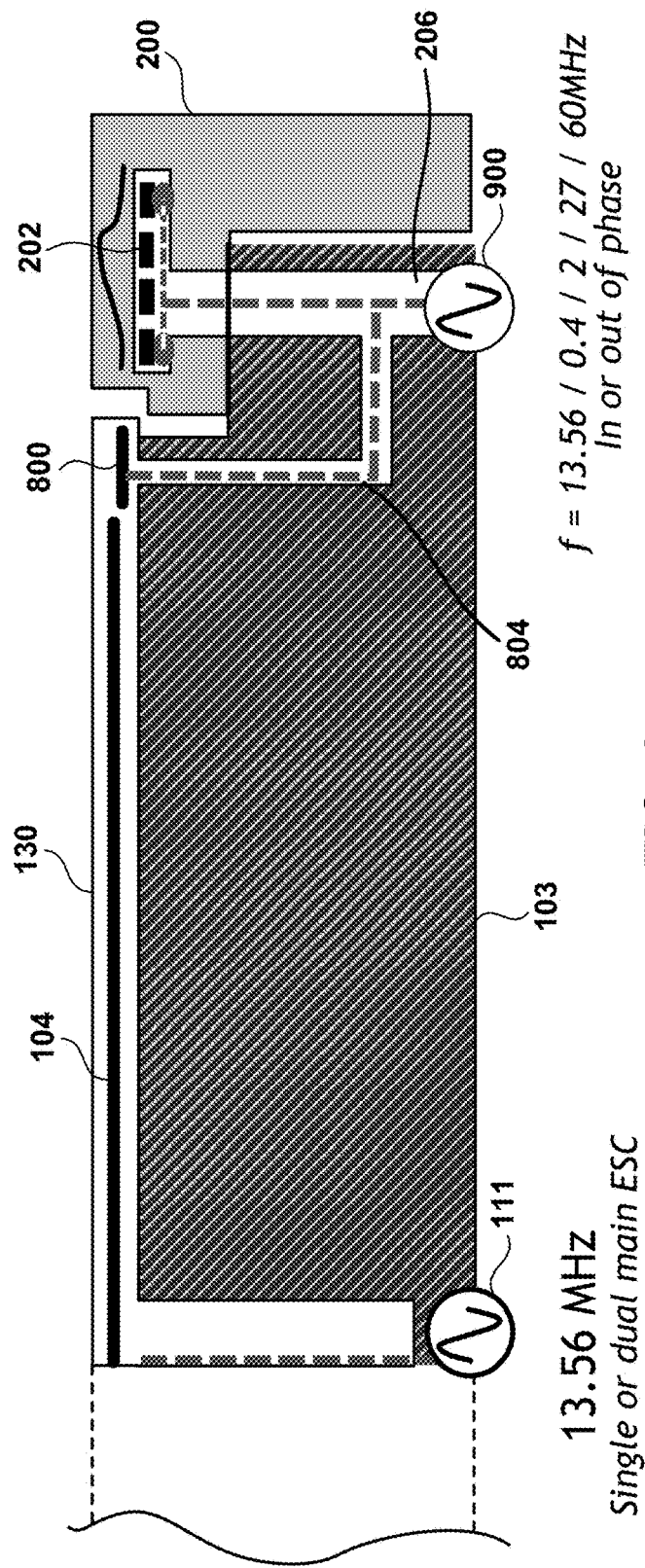
FIG. 9 conceptually illustrates a cross-section of an electrostatic chuck (ESC) and an edge ring, that are configured to be disposed within a plasma process chamber, in accordance with implementations of the disclosure.

FIG. 9 conceptually illustrates a cross-section of an electrostatic chuck (ESC) and an edge ring, that are configured to be disposed within a plasma process chamber, in accordance with implementations of the disclosure. In the illustrated implementation, both of the edge ring annular electrode 202 (as discussed with reference to FIG. 2A), and the ESC annular electrode 800 (as discussed with reference to FIG. 8), are included in the system. The ESC annular electrode 800 and the edge ring annular electrode 202 receive RF power from an RF source 900, via RF feeds 804 and 206, respectively. In another implementation, each of the ESC annular electrode 800 and the edge ring annular electrode 202 are powered by separate RF power sources, which can be independently tuned. The characteristics of the RF power supplied to the ESC annular electrode 800 and the edge ring annular electrode 202 can be tuned to provide for desired etch characteristics at the wafer edge region (e.g. RF power characteristics including voltage, frequency, phase relative to bias voltage, continuous wave/pulsed).

Figure 10:
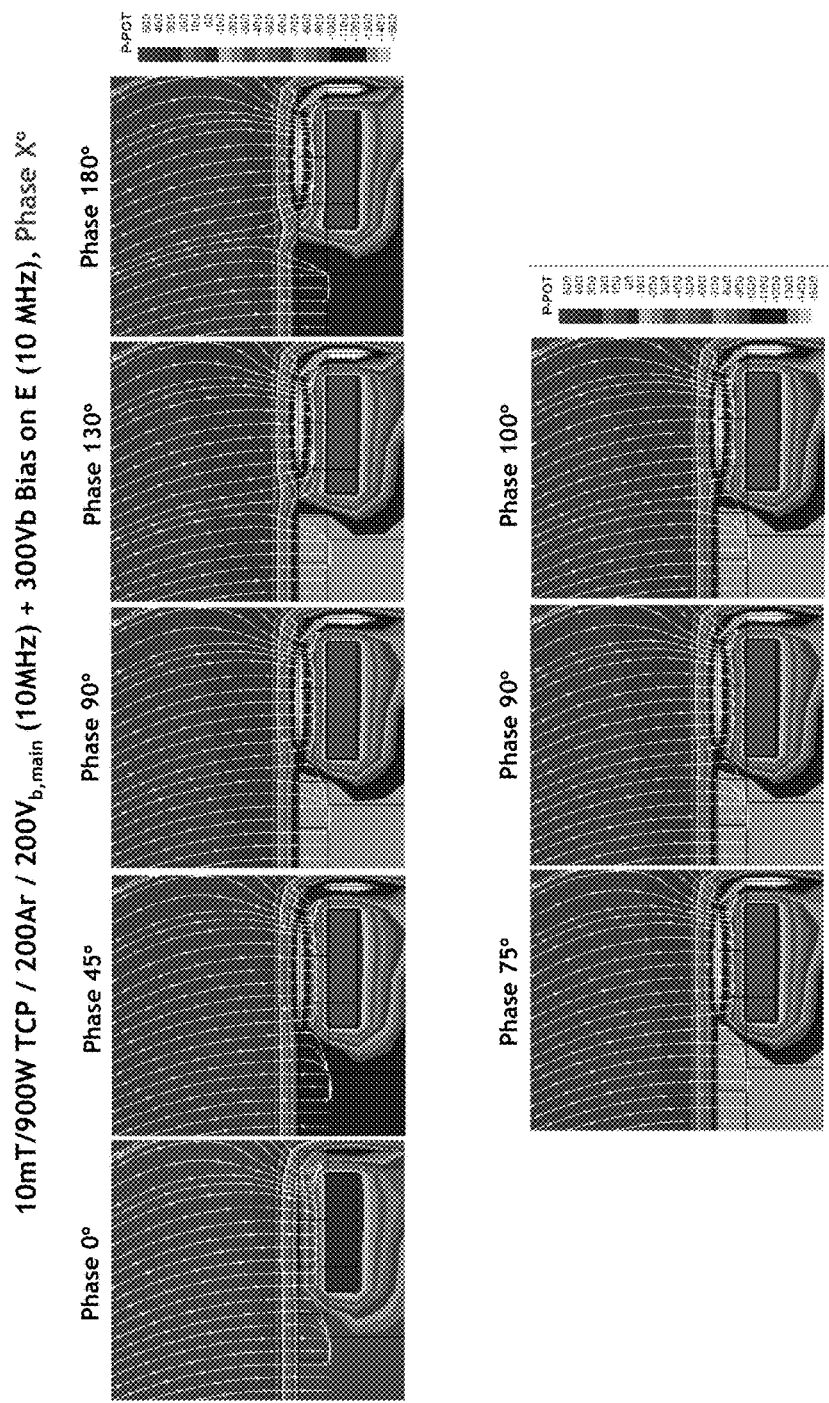
FIG. 10 illustrates the effect of various phase differences between power applied to the ESC and power applied to the annular electrode, in accordance with implementations of the disclosure.

FIG. 10 illustrates the effect of various phase differences between power applied to the ESC and power applied to the annular electrode, in accordance with implementations of the disclosure. The illustrated cross-sectional schematics show the ion flux at various phase angle differences as indicated. The process parameters are as follows: 10 mT pressure, 900 W TCP, 200 sccm Ar, 200V at 10 MHz applied to ESC main electrode, 300V at 10 MHz applied to annular electrode. As can be seen, changes in phase angle affect the electrical potential topography, and consequently affect the distribution and angle of ion flux. Thus, the phase difference between RF power applied to the ESC vs. that applied to the annular electrode can represent another tunable parameter.

Figure 11A:
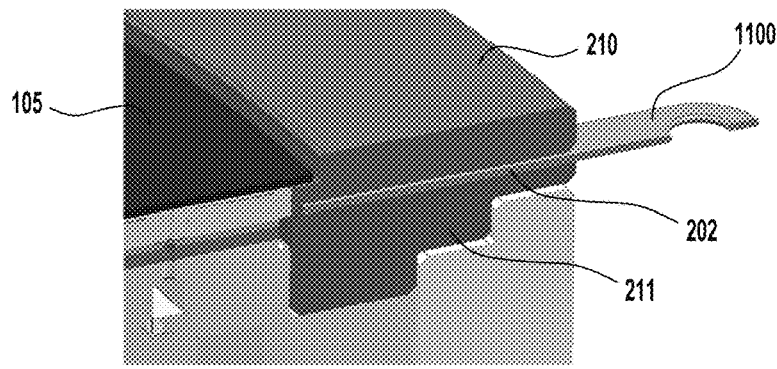
FIG. 11A illustrates a cutaway view of an edge ring assembly, in accordance with implementations of the disclosure.

FIG. 11A illustrates a cutaway view of an edge ring assembly, in accordance with implementations of the disclosure. Sandwiched between the edge ring 210 and dielectric ring 211 is an annular electrode 202. The annular electrode 202 further includes a radial extension 1100 that serves as a contact through which RF power is delivered to the annular electrode 202.

Figure 11B:
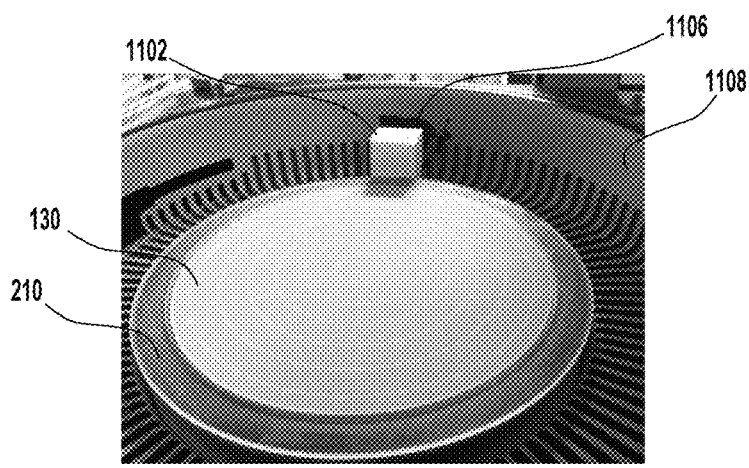
FIGS. 11B and 11C illustrate interior views of the lower bowl of a plasma process chamber, in accordance with implementations of the disclosure.
Figure 11C:
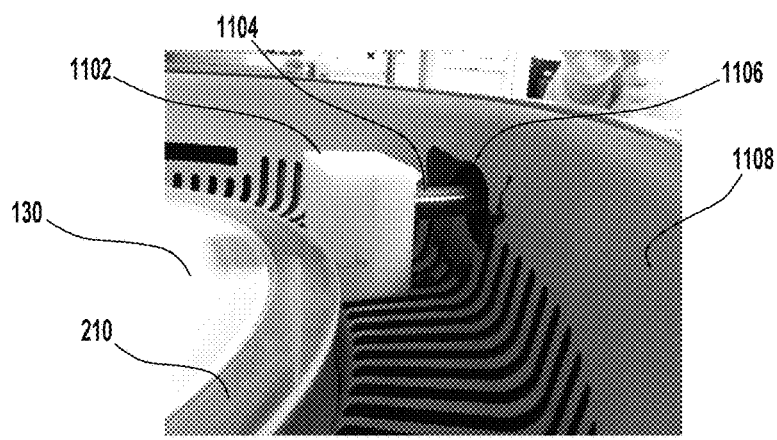

FIGS. 11B and 11C illustrate interior views of the lower bowl of a plasma process chamber, in accordance with implementations of the disclosure. The radial extension 1100 (hidden from view) is covered by an insulator housing 1102, which prevents arcing. A coaxial RF feed 1104 is disposed via a through-hole 1106 defined in a sidewall 1108 of the chamber. The coaxial RF feed 1104 connects to the radial extension 1100 of the annular electrode 202 and delivers RF power from an RF power source. Though a single radial extension is shown, it will be appreciated that there may be several radial extensions which define contacts for the annular electrode, and further such radial extensions may be symmetrically distributed around the annular electrode. For example, in one implementation, the annular electrode 202 includes four radial extensions which are symmetrically distributed around the annular electrode 202, each of which connects to a corresponding coaxial RF feed. In another implementation, the coax RF feed for the annular electrode can be routed from underneath the chamber rather than through the side of the chamber.

Figure 12A:
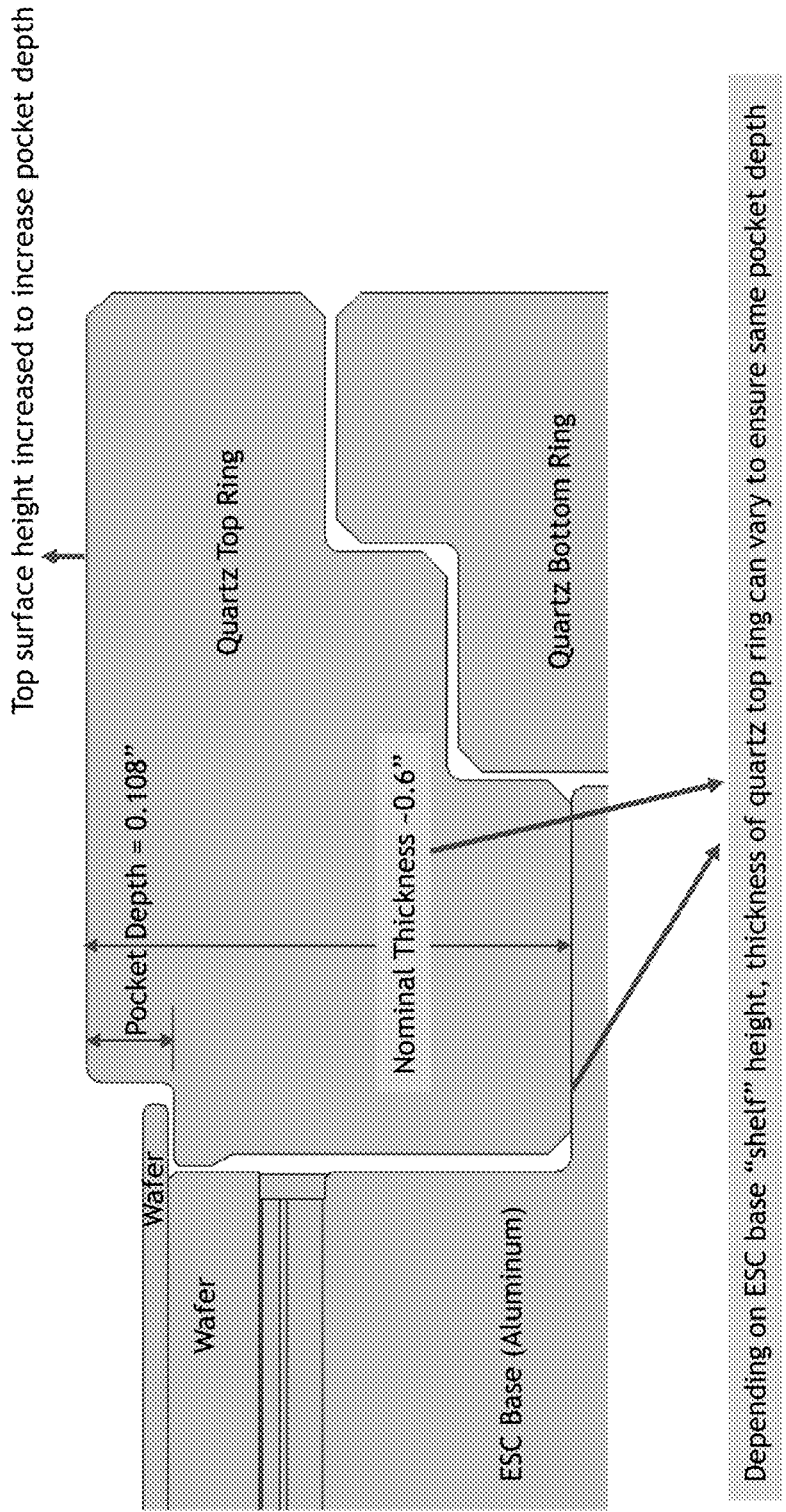
FIG. 12A illustrates a cross-section of an edge ring assembly, in accordance with implementations of the disclosure.

FIG. 12A illustrates a cross-section of an edge ring assembly, in accordance with implementations of the disclosure. The edge ring assembly includes a quartz top ring and a quartz bottom ring, as shown. The height of the top surface of the quartz top ring can be varied to affect the etch rate at the edge of the substrate, as discussed below with reference to FIG. 13.

Figure 12B:
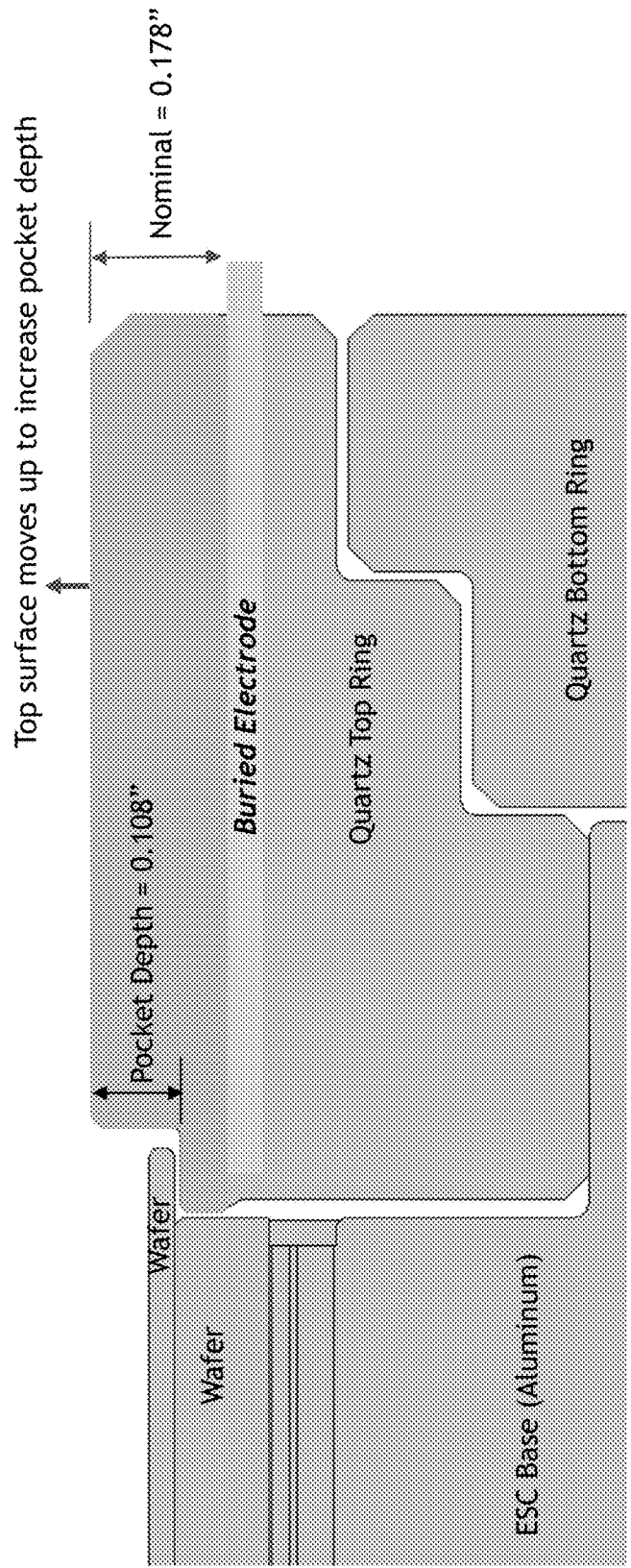
FIG. 12B illustrates a cross-section of an edge ring assembly, in accordance with implementations of the disclosure.

FIG. 12B illustrates a cross-section of an edge ring assembly, in accordance with implementations of the disclosure. The edge ring assembly includes a quartz top ring having an electrode disposed therein, and a quartz bottom ring, as shown. The height of the top surface of the quartz top ring can be varied to affect the etch rate at the edge of the substrate, as discussed below with reference to FIG. 13.

Figure 13:
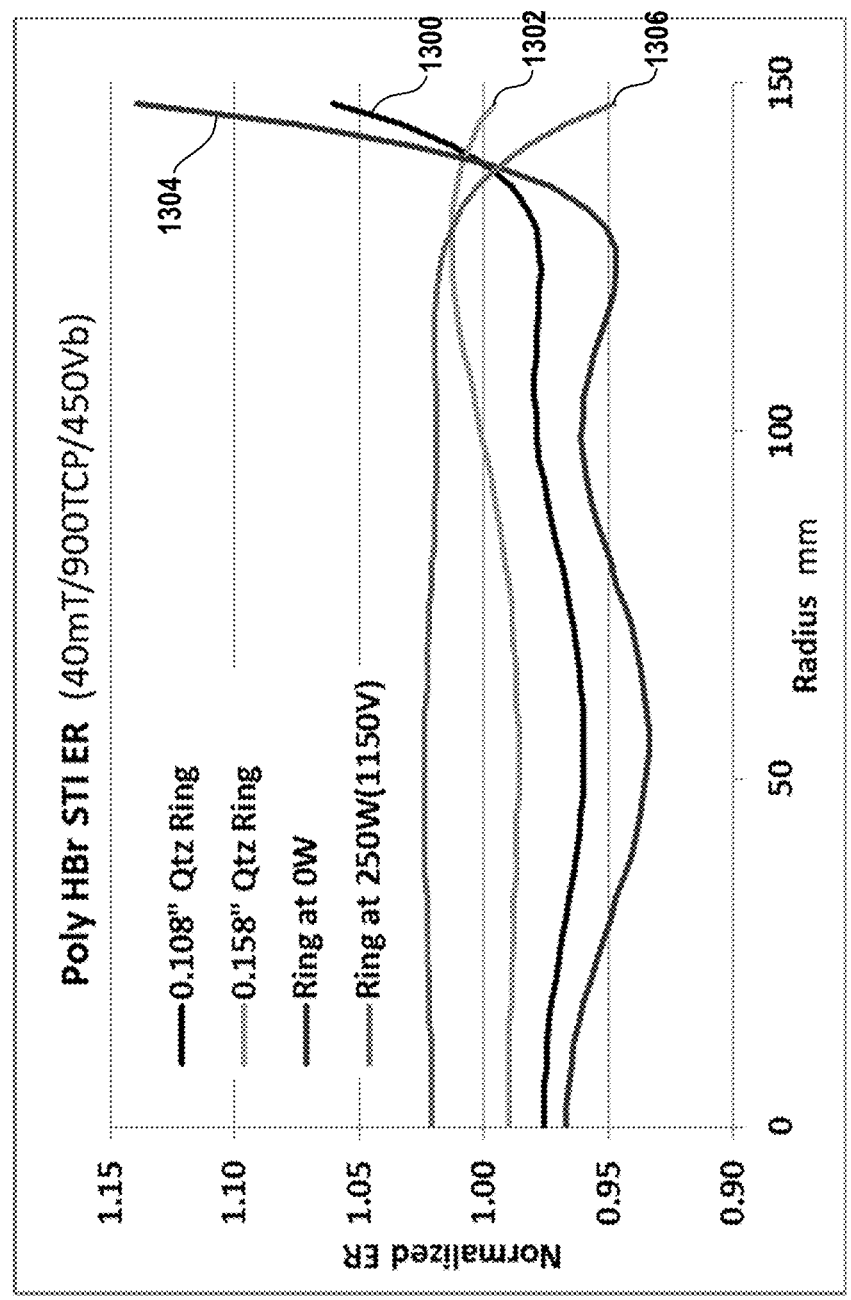
FIG. 13 illustrates etch rate profiles for an HBr plasma process, in accordance with implementations of the disclosure.

FIG. 13 illustrates etch rate profiles for an HBr plasma process, in accordance with implementations of the disclosure. In the illustrated graph, the curve 1300 illustrates the normalized etch rate for a standard full quartz edge ring having a pocket depth of 2.74 mm (0.108 inches). The curve 1302 illustrates the normalized etch rate for a standard full quartz edge ring having a pocket depth of 4.01 mm (0.158 inches). As can be seen, increasing the pocket depth has the effect of reducing the etch rate at the substrate edge region. The curve 1304 illustrates the normalized etch rate for an edge ring assembly wherein the quartz top ring includes an electrode that is unpowered (at 0 W). The curve 1306 illustrates the normalized etch rate for an edge ring assembly wherein the quartz top ring includes an electrode that is powered at 250 W. As shown, powering the electrode reduces the etch rate in the edge region as compared to the unpowered results.

Figure 14:
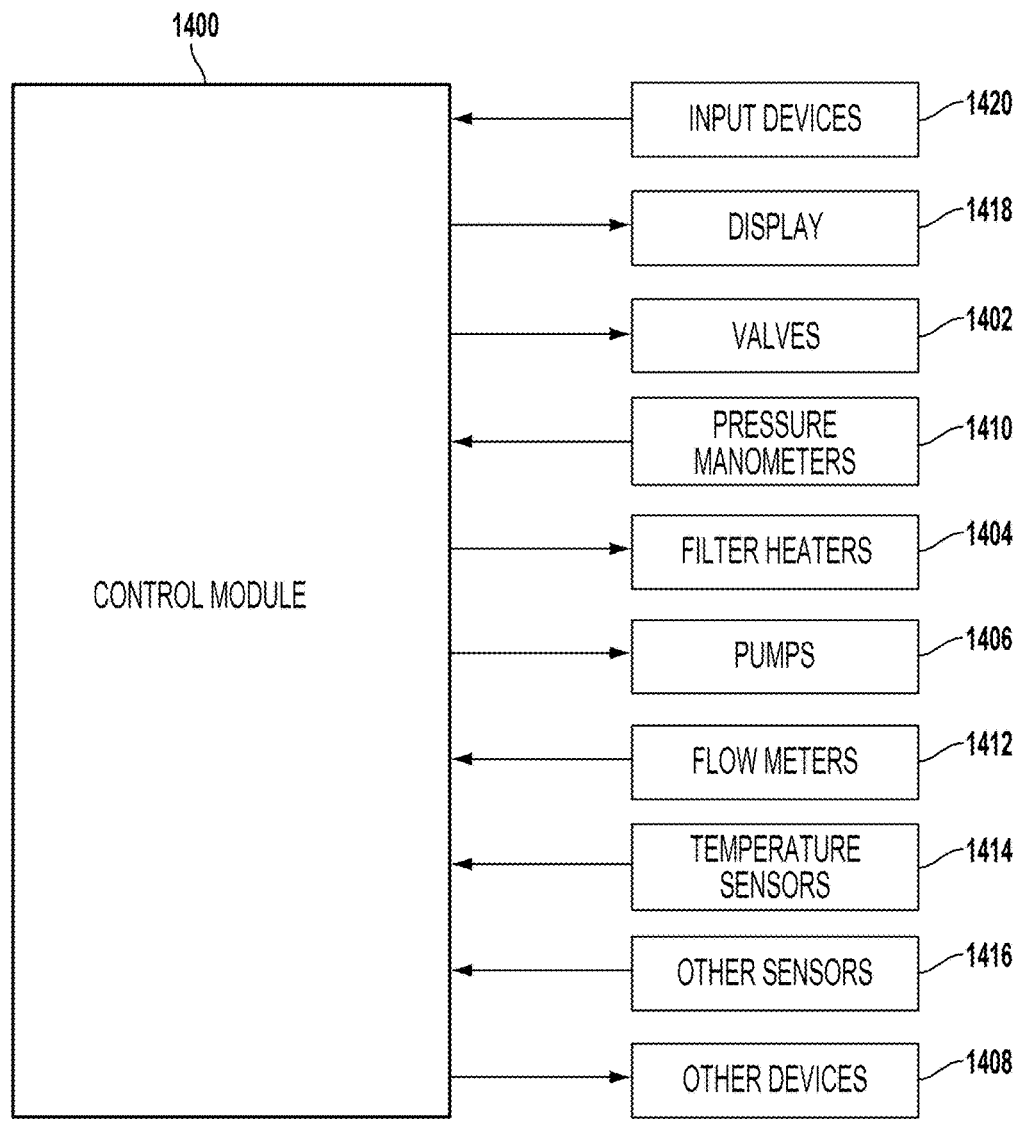
FIG. 14 shows a control module 1400 for controlling the systems of the present disclosure.

FIG. 14 shows a control module 1400 for controlling the systems described above. For instance, the control module 1400 may include a processor, memory and one or more interfaces. The control module 1400 may be employed to control devices in the system based in part on sensed values. For example only, the control module 1400 may control one or more of valves 1402, filter heaters 1404, pumps 1406, and other devices 1408 based on the sensed values and other control parameters. The control module 1400 receives the sensed values from, for example only, pressure manometers 1410, flow meters 1412, temperature sensors 1414, and/or other sensors 1416. The control module 1400 may also be employed to control process conditions during precursor delivery and plasma processing. The control module 1400 will typically include one or more memory devices and one or more processors.

The control module 1400 may control activities of the precursor delivery system and plasma processing apparatus. The control module 1400 executes computer programs including sets of instructions for controlling process timing, delivery system temperature, pressure differentials across the filters, valve positions, mixture of gases, chamber pressure, chamber temperature, wafer temperature, RF power levels, wafer ESC or pedestal position, and other parameters of a particular process. The control module 1400 may also monitor the pressure differential and automatically switch vapor precursor delivery from one or more paths to one or more other paths. Other computer programs stored on memory devices associated with the control module 1400 may be employed in some embodiments.

Typically there will be a user interface associated with the control module 1400. The user interface may include a display 1418 (e.g. a display screen and/or graphical software displays of the apparatus and/or process conditions), and user input devices 1420 such as pointing devices, keyboards, touch screens, microphones, etc.

Computer programs for controlling delivery of precursor, plasma processing and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or ESC and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer ESC.

Examples of sensors that may be monitored during processing include, but are not limited to, mass flow control modules, pressure sensors such as the pressure manometers 1410, and thermocouples located in delivery system, the pedestal or ESC (e.g. the temperature sensors 1414). Appropriately programmed feedback and control algorithms may be used with data from these sensors to maintain desired process conditions. The foregoing describes implementation of embodiments of the disclosure in a single or multi-chamber semiconductor processing tool.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. An edge ring assembly for a plasma processing chamber, comprising:
    an edge ring configured to surround an electrostatic chuck (ESC) that is configured for electrical connection to a first RF power supply, the ESC having a top surface for supporting a substrate and an annular step surrounding the top surface, the annular step defining an annular shelf that is lower than the top surface;
    an annular electrode disposed below the edge ring and above the annular shelf;
    a dielectric ring disposed below the annular electrode for isolating the annular electrode from the ESC, the dielectric ring positioned over the annular shelf; and
    a plurality of insulated connectors disposed through the ESC and through the dielectric ring, each of the plurality of insulated connectors providing electrical connection between a second RF power supply and the annular electrode.

2. The edge ring assembly of claim 1, wherein each of the plurality of insulated connectors is defined by a coaxial connector.

3. The edge ring assembly of claim 1, wherein the plurality of insulated connectors are configured to isolate the second RF power supply from the first RF power supply.

4. The edge ring assembly of claim 1, wherein the edge ring has a top surface, the top surface of the edge ring having a stepped edge defined at an inner diameter of the edge ring, a lower portion of the stepped edge is configured to sit at a lower height than the top surface of the ESC, such that the substrate when present extends over the lower portion of the stepped edge.

5. The edge ring assembly of claim 4, wherein at least a portion of the annular electrode is disposed below the stepped edge of the edge ring.

6. The edge ring assembly of claim 1, wherein application of RF power to the annular electrode during plasma processing causes a plasma sheath that is defined during the plasma processing to be radially extended in a spatial region that is defined substantially over the edge ring.

7. The edge ring assembly of claim 6, wherein the application of RF power to the annular electrode during plasma processing reduces ion focusing at an edge region of the substrate.

8. The edge ring assembly of claim 7, wherein the application of RF power to the annular electrode during plasma processing reduces tilting of ion trajectories at the edge region of the substrate away from normal to a top surface of the substrate.

9. The edge ring of assembly of claim 1, wherein the annular electrode has a radial width of about 5 to 28 millimeters.

10. The edge ring assembly of claim 1, wherein the annular electrode has a thickness of about 0.5 mm to 5 millimeters.

11. The edge ring assembly of claim 1, wherein the annular electrode is defined by a plurality of concentric electrodes, each of the plurality of concentric electrodes being electrically connected to the second RF power supply.

12. The edge ring assembly of claim 1, wherein the annular electrode is defined by a mesh-like structure of a conductive material.

13. The edge ring assembly of claim 1, wherein the annular electrode is integrated with the edge ring.

14. The edge ring assembly of claim 1, wherein the annular electrode has a radial width that is at least as wide as a radial width of the edge ring.

15. A system for plasma processing, comprising:
a process chamber;
an electrostatic chuck (ESC) disposed in the process chamber, the ESC having a top surface that is configured to support a substrate during plasma processing, the ESC further including an annular step surrounding the top surface, the annular step defining an annular shelf at a lower height than the top surface, the annular shelf configured to accommodate an edge ring assembly, the edge ring assembly including an edge ring configured to surround the ESC, an annular electrode disposed below the edge ring, and a dielectric ring disposed below the annular electrode and over the annular shelf;
a bias electrode disposed within the ESC, the bias electrode configured to receive RF power from a first RF power supply to generate a bias voltage on the substrate;
a plurality of insulated connectors disposed through the ESC, the plurality of insulated connectors configured to be disposed through the dielectric ring, each of the plurality of insulated connectors configured to provide electrical connection between a second RF power supply and the annular electrode.

16. The system of claim 15, wherein each of the plurality of insulated connectors is defined by a coaxial connector.

17. The system of claim 15, wherein the plurality of insulated connectors are configured to isolate the second RF power supply from the first RF power supply.

18. A system for plasma processing, comprising:
a process chamber;
an electrostatic chuck (ESC) disposed in the process chamber, the ESC having a top surface that is configured to support a substrate during plasma processing, the ESC further including an annular step surrounding the top surface, the annular step defining an annular shelf at a lower height than the top surface, the annular shelf configured to accommodate an edge ring assembly, the edge ring assembly including an edge ring configured to surround the ESC, the edge ring assembly further including a dielectric ring;
a bias electrode disposed within the ESC, the bias electrode configured to receive RF power from a first RF power supply to generate a bias voltage on the substrate;
an annular electrode disposed within the ESC, the annular electrode being disposed below a peripheral region of the top surface of the ESC; and
a plurality of insulated connectors disposed through the ESC, each of the plurality of insulated connectors configured to provide electrical connection between a second RF power supply and the annular electrode;
wherein the dielectric ring is disposed below the annular electrode and over the annular shelf.

19. The system of claim 18, wherein the annular electrode and the plurality of insulated connectors are configured to isolate the second RF power supply from the first RF power supply.

20. The system of claim 18, wherein a first portion of the annular electrode is disposed below the substrate when present on the top surface of the ESC, and wherein a second portion of the annular electrode extends radially beyond a diameter of the substrate.

21. The system of claim 18, wherein the first RF power supply and the second RF power supply are configured to provide respective RF powers at a predefined phase angle difference.

* * * * *